US009660345B1

(12) United States Patent
Gu et al.

(10) Patent No.: US 9,660,345 B1
(45) Date of Patent: May 23, 2017

(54) MILLIMETER-WAVE COMMUNICATIONS ON A MULTIFUNCTION PLATFORM

(71) Applicant: INTERNATIONAL BUSINESS MACHINES CORPORATION, Armonk, NY (US)

(72) Inventors: Xiaoxiong Gu, White Plains, NY (US); Duixian Liu, Scarsdale, NY (US); Bodhisatwa Sadhu, Fishkill, NY (US); Alberto Valdes Garcia, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/157,841

(22) Filed: May 18, 2016

(51) Int. Cl.
| | | |
|---|---|---|
| *H04B 7/00* | (2006.01) |
| *H01Q 9/04* | (2006.01) |
| *H04W 16/28* | (2009.01) |
| *H01Q 7/00* | (2006.01) |
| *H01Q 1/24* | (2006.01) |
| *H01Q 1/50* | (2006.01) |
| *H04B 1/04* | (2006.01) |

(52) U.S. Cl.
CPC ........... *H01Q 9/0407* (2013.01); *H01Q 1/242* (2013.01); *H01Q 1/50* (2013.01); *H01Q 7/00* (2013.01); *H04W 16/28* (2013.01); *H04B 2001/0408* (2013.01)

(58) Field of Classification Search
CPC ........ H01Q 9/0407; H01Q 1/242; H01Q 1/50; H01Q 7/00; H04W 16/28
USPC .......................................... 455/277.1, 279.1
See application file for complete search history.

(56) References Cited

U.S. PATENT DOCUMENTS

| | | | |
|---|---|---|---|
| 7,995,969 B2 | 8/2011 | Hardacker | |
| 8,706,165 B2 * | 4/2014 | Skarby | H01Q 1/246 |
| | | | 343/751 |
| 8,837,564 B2 | 9/2014 | Ridel et al. | |
| 9,444,140 B2 * | 9/2016 | Maltsev | H01Q 3/34 |

(Continued)

FOREIGN PATENT DOCUMENTS

EP    2667449 A1    11/2013

OTHER PUBLICATIONS

Singh et al., "Millimeter Wave WPAN: Cross-Layer Modeling and Multihop Architecture", IEEE, 2007.

*Primary Examiner* — Md Talukder
(74) *Attorney, Agent, or Firm* — Keivan Razavi

(57) ABSTRACT

A millimeter-wave (MMW) communication system may include an antenna array structure operating within a MMW band, having both a first antenna coupling point and a second antenna coupling point, whereby the first and the second location of the antenna coupling points are within a coplanar surface on which the antenna array structure is formed. The system may further include a single MMW transmitter device having a power splitter that splits a data modulated MMW signal into a first MMW data modulated signal and a second MMW data modulated signal identical to the first MMW data modulated signal, such that the first data modulated MMW signal is coupled to the first antenna coupling point for radio propagation at a first direction, and the second data modulated MMW signal is coupled to the second antenna coupling point for radio propagation at a second direction.

11 Claims, 16 Drawing Sheets

(56) References Cited

U.S. PATENT DOCUMENTS

| | | | |
|---|---|---|---|
| 2003/0022694 A1* | 1/2003 | Olsen | G01V 8/005 |
| | | | 455/562.1 |
| 2005/0159187 A1* | 7/2005 | Mendolia | G01S 5/04 |
| | | | 455/562.1 |
| 2011/0300885 A1* | 12/2011 | Darabi | H04B 1/52 |
| | | | 455/500 |
| 2012/0194377 A1* | 8/2012 | Yukumatsu | G01S 13/931 |
| | | | 342/70 |
| 2013/0040594 A1* | 2/2013 | Vilhar | G01R 29/10 |
| | | | 455/226.4 |
| 2013/0095895 A1* | 4/2013 | Asuri | H04B 1/0064 |
| | | | 455/571 |
| 2013/0308717 A1* | 11/2013 | Maltsev | H04B 7/0417 |
| | | | 375/267 |
| 2014/0292090 A1 | 10/2014 | Cordeiro et al. | |
| 2015/0171523 A1 | 6/2015 | Kamgaing et al. | |
| 2015/0326359 A1 | 11/2015 | Subramanian et al. | |

\* cited by examiner

MILLIMETER-WAVE COMMUNICATIONS ON A MULTIFUNCTION PLATFORM

BACKGROUND

The present invention generally relates to telecommunication systems, and more particularly, to millimeter-wave (MMW) communication systems.

MMW communication technology offers a vast array of high-speed capabilities, especially with the emergence of high-bandwidth-requirement data services such as, but not limited to, the transfer or downloading of uncompressed high definition (HD) TV data. The MMW band extends from about 28-300 GHz, which enables single or multichannel carrier signals capable of Gigabit transmission speeds.

BRIEF SUMMARY

Among other things, the systems and methods of the present invention provide a mechanism of directionally switching millimeter-wave (MMW) line-of-sight (LOS) radio signal propagations using antenna array structures directly formed on a single planar surface. The antenna array structures include multiple antenna feeds that are coplanar with respect to the single planar surface, such that each feed receives and/or transmits along a different propagation direction.

According to one embodiment, a millimeter-wave (MMW) communication system includes an antenna array structure operating within a MMW band, whereby the antenna array structure has both a first antenna coupling point at a first location of the antenna array structure and a second antenna coupling point at a second location of the antenna array structure. The first and the second location of the antenna coupling points are within a coplanar surface on which the antenna array structure is formed. The MMW communication system further includes a single MMW transmitter device having a power splitter that splits a data modulated MMW signal into a first MMW data modulated signal and a second MMW data modulated signal that is identical to the first MMW data modulated signal. The first data modulated MMW signal is coupled to the first antenna feed point while the second data modulated MMW signal is coupled to the second antenna feed point. The first data modulated MMW signal that is coupled to the first antenna feed point generates a first MMW radio signal that is transmitted at a first propagation direction by the antenna array structure. The second data modulated MMW signal that is coupled to the second antenna feed point accordingly generates a second MMW radio signal transmitted at a second propagation direction that is different to the first propagation direction by the antenna array structure.

According to another exemplary embodiment, a millimeter-wave (MMW) communication system includes an antenna array structure operating within a MMW band, whereby the antenna array structure has both a first antenna coupling point at a first location of the antenna array structure and a second antenna coupling point that is at a second location of the antenna array structure. The first and the second location of the antenna coupling points are within a coplanar surface on which the antenna array structure is formed. The communication system further includes a single MMW receiver device having a power combiner that receives one of a first MMW radio signal and a second MMW radio signal such that the first MMW radio signal is received from the first antenna coupling point and the second MMW radio signal is received from the second antenna coupling point. The first received MMW radio signal at the first antenna coupling point is received by the antenna array structure from a first propagation direction, while the second received MMW radio signal at the second antenna coupling point is received by the antenna array structure from a second propagation direction that is different from the first propagation direction.

According to yet another exemplary embodiment, a millimeter-wave (MMW) communication system includes an antenna array structure operating within a MMW band, whereby the antenna array structure has both a first antenna coupling point at a first location of the antenna array structure and a second antenna coupling point that is at a second location of the antenna array structure. The first and the second location of the antenna coupling points are within a coplanar surface on which the antenna array structure is formed. A first MMW transmitter device couples a first data modulated MMW signal to the first antenna coupling point, while a second MMW transmitter device couples a second data modulated MMW signal different to the first data modulated MMW signal to the second antenna feed point. Coupling the first data modulated MMW signal to the first antenna coupling point generates a first MMW radio signal transmitted at a first propagation direction by the antenna array structure at a first operating frequency. Also, coupling the second data modulated MMW signal to the second antenna coupling point generates a second MMW radio signal transmitted at a second propagation direction by the antenna array structure at a second operating frequency. The second propagation direction is different to the first propagation direction.

According to yet another exemplary embodiment, a method of millimeter-wave (MMW) communications includes generating a data modulated MMW signal and splitting the data modulated MMW signal into a first data modulated MMW signal and a second data modulated MMW signal that is identical to the first data modulated MMW signal. The first data modulated MMW signal is coupled via a first switch to a first antenna coupling point of an antenna array structure operating within a MMW band. Also, the second data modulated MMW signal is coupled via a second switch to a second antenna coupling point of the antenna array structure, whereby the first and the second location of the antenna coupling points are within a coplanar surface over which the antenna array structure is formed.

According to yet another exemplary embodiment, a method of millimeter-wave (MMW) communications includes generating a first data modulated MMW signal from a first baseband signal generator and a first MMW source operating at a first MMW frequency, and generating a second data modulated MMW signal from a second baseband signal generator and a second MMW source operating at a second MMW frequency. The first data modulated MMW signal is coupled via a first switch to a first antenna coupling point of an antenna array structure operating within a MMW band. The second data modulated MMW signal is coupled via a second switch to a second antenna coupling point of the antenna array structure, whereby the first and the second location of the antenna coupling points are within a coplanar surface on which the antenna array structure is formed.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Communications to electronic devices such as portable electronic devices (e.g., smartphones, charging pads, etc.) can either be in the form of a wired connection, or a wireless connection operating at relatively low data-rates (e.g., 1 Mbit/s) and frequencies (e.g., 2.4 GHz) using technologies such as Bluetooth, or near field communications (NFC). Thus, millimeter-wave-based high data-rate connections to such devices, among other things, enable near instantaneous video/photo synchronization, video streaming, etc. However due to the directional nature of millimeter-wave (MMW) propagation, wireless link coverage can either be limited, or require high-cost complex solutions, such as, phased array antenna systems. The one or more exemplary embodiments described herein, among other things, facilitate high speed (e.g., 7-20 Gigabit/s), low cost, and reliable MMW band communications between electronic devices.

In particular, the described embodiments generate directionally switchable antenna systems operating within the millimeter-wave band (e.g., 60 GHz region between 57-66 GHz) of the radio spectrum. Within the 60 GHz operating region of the electromagnetic spectrum, the propagated MMW radio signals undergo high atmospheric oxygen absorption and thus attenuation. While this high attenuation factor reduces transmission range, it offers frequency reuse advantages for mobile based applications. The described example MMW band is, however, exemplary. According to another example, a 28 GHz operating region may be utilized for 5G communication systems.

Figure 1:
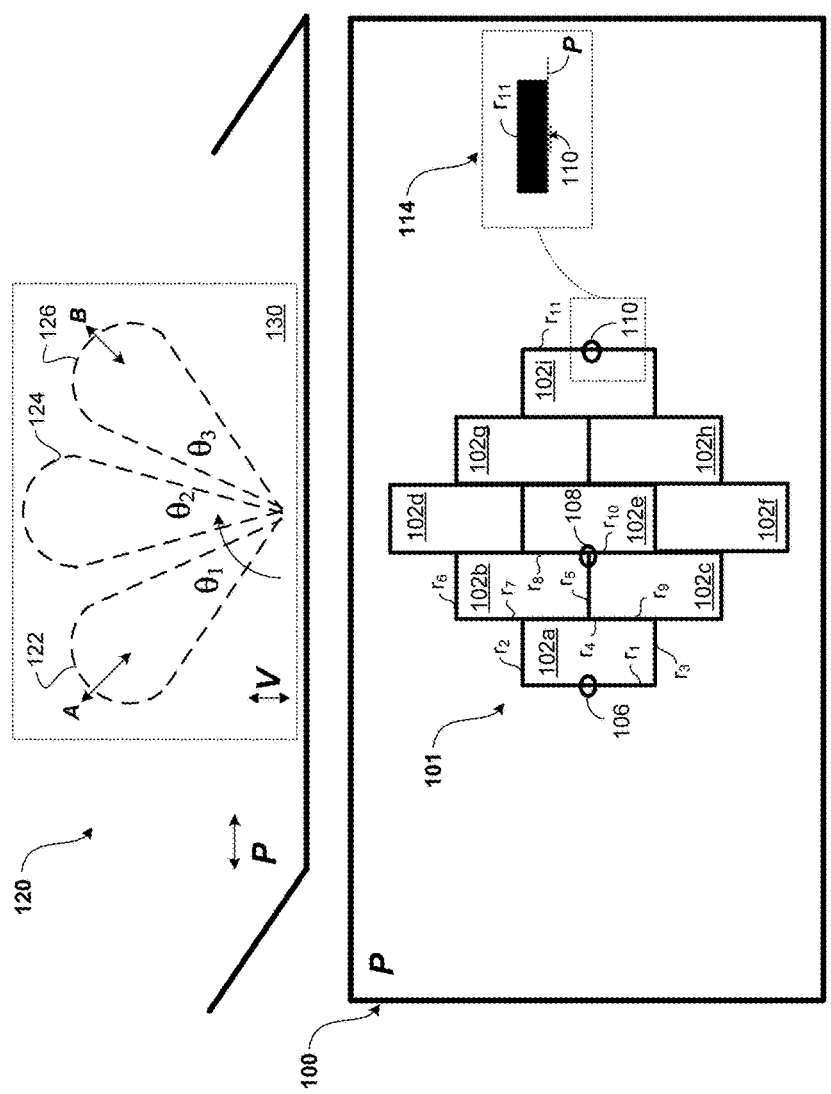
FIG. 1 shows an antenna array structure such as a grid antenna structure, according to one embodiment.

FIG. 1 shows a plan view 100 of an antenna array structure such as a grid antenna structure 100, according to one embodiment. As depicted, the grid antenna structure 101 includes a plurality of loops 102a-102i, which are formed on surface P. Each of the plurality of loops 102a-102i include antenna radiator elements. For example, loop 102a has antenna radiator elements $r_1$, $r_2$, $r_3$, and $r_4$. According to another example, loop 102b includes antenna radiator elements $r_5$, $r_6$, $r_7$, and $r_8$. As illustrated, portions of antenna radiator elements corresponding to one loop may be shared by the radiator elements of other adjacent loops. For example, radiator element $r_4$ of loop 102a is also shared with adjacent loops 102b and 102c. In particular, radiator element $r_9$ of loop 102c forms part of radiator element $r_4$ of loop 102a. Also, radiator element $r_7$ of loop 102b forms part of radiator element $r_4$ of loop 102a. According to another example, radiator element $r_5$ is shared between loops 102b and 102c. As such, the grid antenna structure 101, and thus, all the antenna radiator elements forming the plurality of loops 102a-102i are formed on a coplanar surface such as surface P.

The grid antenna structure 101 also includes multiple antenna coupling points 106, 108, 110, whereby at such points, radio signals are coupled to the grid antenna structure 101 for free-space propagation. As depicted, the antenna coupling points 106, 108, 110 are positioned at different locations on the grid antenna structure 101. For example, antenna coupling point 106 is located on radiator element $r_1$ of loop 102a, while antenna coupling point 108 is located at the intersection of radiator elements $r_5$ and no of respective loops 102b, 102c, and 102e. Further, antenna coupling point 110 is located on radiator element $r_{11}$ of loop 102i. Since the coupling points 106, 108, 110 are coupled to the antenna radiator elements forming the plurality of loops 102a-102i, these coupling points 106, 108, 110, as with the antenna radiator elements, are also located within a coplanar surface such as surface P. An exemplary cross-sectional exploded view 114 of coupling point 110 illustrates this further by showing the coupling point 110 as the region or area contacting the undersurface of the radiator element $r_{11}$ located on surface P, which receives a signal for radio transmission. Thus, the radiator element $r_{11}$ and coupling point 110 are located on a common plane.

Although the exemplary grid antenna structure 101 embodiment shows three coupling points 106, 108, 110, any number of coupling points distributed at different locations may be provided for feeding a signal to the antenna structure. In operation, receiving a signal at each coupling point generates a different radio propagation direction. This in turn enables the directional transmission of radio signals in predominantly line-of-sight (LOS) communication systems such as MMW systems. As further depicted in FIG. 1, signal transmission diagram 120 illustrates the effect of applying a signal such as a modulated MMW signal to each of coupling points 106, 108, and 110. For example, applying the modulated MMW signal to coupling point 106 generates a MMW radio signal propagation direction 122 having an elevation angle ($\theta_1$) in the range of about 40-50 degrees. Alternatively, applying the modulated MMW signal to coupling point 108 generates a MMW radio signal radio propagation direction 124 having another elevation angle ($\theta_2$) in the range of about 85-95 degrees. Further, applying the modulated MMW signal to coupling point 110 generates a MMW radio signal radio propagation direction 126 having yet another elevation angle ($\theta_3$) in the range of about 140-150 degrees. In the depicted example, the MMW radio signal propagation directions 122, 124, 126 are within a plane (V) 130 that is substantially perpendicular to surface P, on which the grid antenna structure 101 is formed.

The grid antenna structure 101 may be designed to operate as either a resonant antenna, whereby the radiator elements may typically be half-wavelengths in size, or as a travelling wave antenna. In either design, the size of the radiator elements are, among other things, governed by the required gain and operating frequency of the antenna, and thus vary accordingly.

Figure 2:
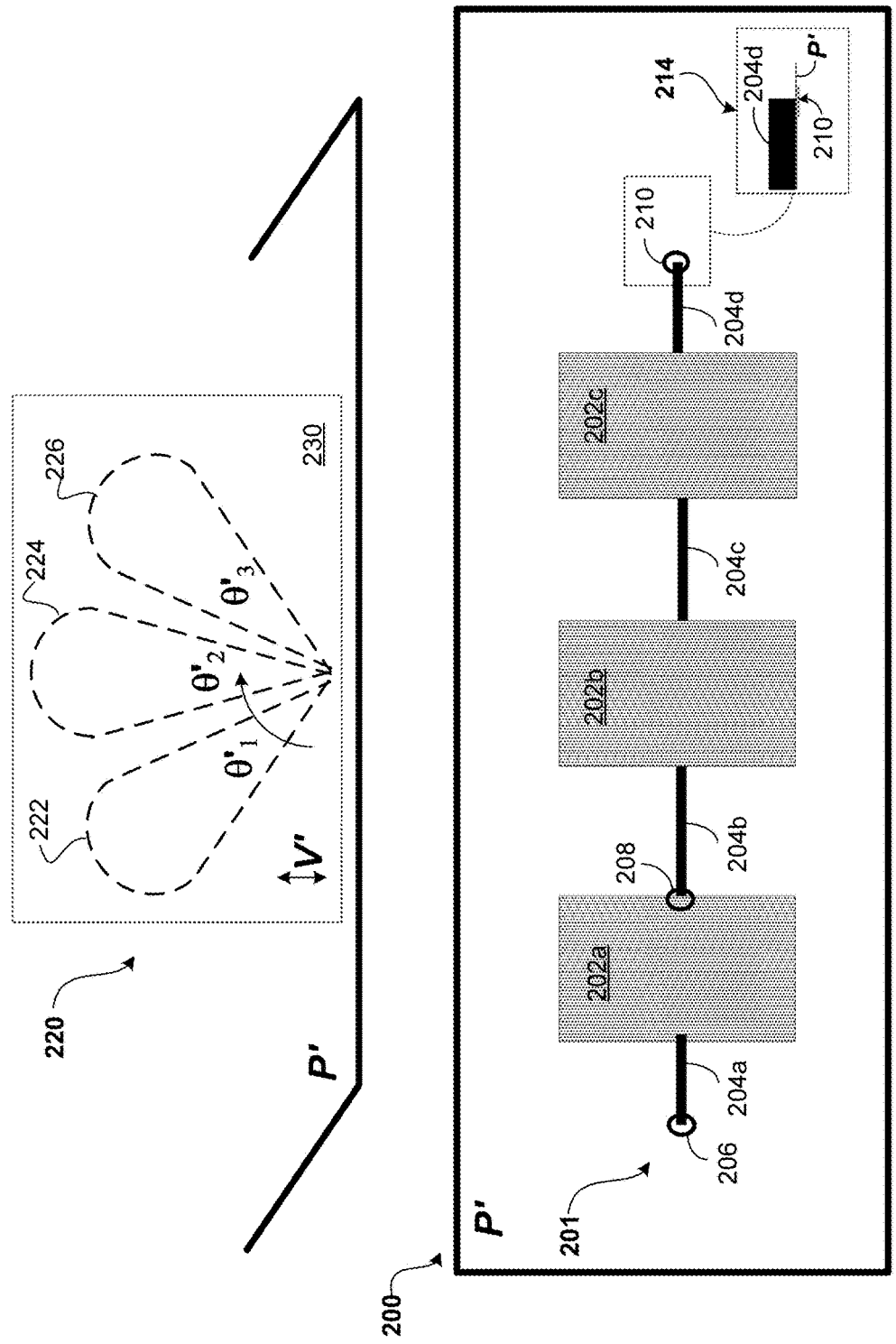
FIG. 2 shows an antenna array structure such as a series fed patch antenna structure, according to one embodiment.

FIG. 2 shows a plan view 200 of an antenna array structure such as a series fed patch antenna structure 201, according to one embodiment. As depicted, the series fed patch antenna structure 201 includes a plurality of patches 202a-202c having conductive connections 204a, 204b, 204c, 204d, which are formed on surface V. More specifically, conductive connection 204a is electrically coupled to patch 202a, while conductive connection 204b electrically couples adjacent patches 202a and 202b. Similarly, conductive connection 204c electrically couples adjacent patches 202b and 202c, while conductive connection 204d is electrically coupled to patch 202c. The series fed patch antenna structure 201 also includes multiple antenna coupling points 206, 208, 210, whereby at such points, radio signals are coupled to the series fed patch antenna structure 201 for free-space propagation.

As depicted, the antenna coupling points 206, 208, 210 are positioned at different locations on the series fed patch antenna structure 201. For example, antenna coupling point 206 is located on conductive connection 204a, while antenna coupling point 208 is located at the intersection of conductive connection 204b with patch 202a. Further, antenna coupling point 210 is located on conductive connection 204d. Since the coupling points 206, 208, 210 are coupled to the series fed patch antenna structure 201, these coupling points 106, 108, 110 are also located within a coplanar surface such as surface V. As such, the plurality of patches 202a-202c, the conductive connections 204a, 204b, 204c, 204d of the series fed patch antenna structure 201, and the coupling points 206, 208, 210 are all formed on a coplanar surface such as surface V. An exemplary cross-sectional exploded view 214 of coupling point 210 illustrates this further by showing the coupling point 210 as the region or area contacting the undersurface of the conductive connection 204d located on surface P'. Thus, the conductive connection 204d and coupling point 210 are located on a common plane.

Although the exemplary series fed patch antenna structure 201 embodiment shows three coupling points 206, 208, 210 and three patches 202a-202c, any number of coupling points distributed across different locations of any plurality patches may be provided for feeding a signal to the antenna structure. In operation, as with the grid antenna structure 101 of FIG. 1, receiving a signal at each coupling point generates a different radio propagation direction. This in turn enables the directional transmission of radio signals in predominantly line-of-sight (LOS) communication systems such as MMW systems. As further depicted in FIG. 2, signal transmission diagram 220 illustrates the effect of applying a signal such as a modulated MMW signal to each of coupling points 206, 208, and 210. For example, applying the modulated MMW signal to coupling point 206 generates a MMW radio signal propagation direction 222 having an elevation angle ($\theta'_1$) in the range of about 40-50 degrees. Alternatively, applying the modulated MMW signal to coupling point 208 generates a MMW radio signal radio propagation direction 224 having another elevation angle ($\theta'_2$) in the range of about 85-95 degrees. Further, applying the modulated MMW signal to coupling point 210 generates a MMW radio signal radio propagation direction 226 having yet another elevation angle ($\theta'_3$) in the range of about 140-150 degrees. In the depicted example, the MMW radio signal propagation directions 222, 224, 226 are within a plane (V') 230 that is substantially perpendicular to surface P', on which the series fed patch antenna structure 201 is formed. The series fed patch antenna structure 201 may be designed to operate as either a resonant antenna or as a travelling wave antenna. In either design, the size of the patch elements are, among other things, governed by the required gain and operating frequency of the antenna, and thus vary accordingly.

Figure 3:
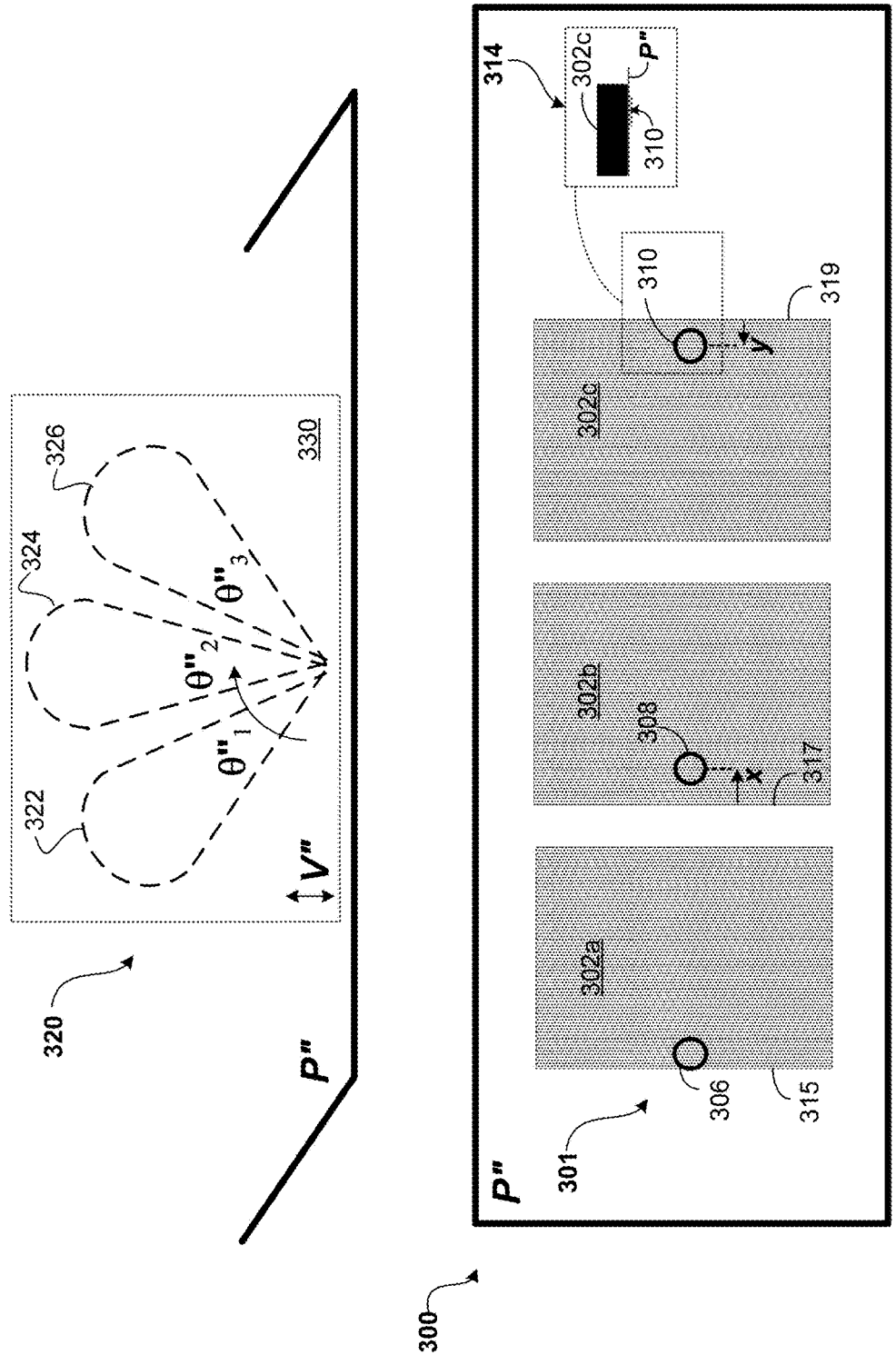
FIG. 3 shows an antenna array structure such as a coupled patch antenna structure, according to one embodiment.

FIG. 3 shows a plan view 300 of an antenna array structure such as a coupled patch antenna structure 301, according to one embodiment. As depicted, the coupled patch antenna structure 301 includes a plurality of patches 302a-302c that are inductively coupled and formed on surface P''. More specifically, patch 302a is inductively coupled to adjacent patch 302b, while patch 302b is inductively coupled to patch 302c. The coupled patch antenna structure 301 also includes multiple antenna coupling points 306, 308, 310, whereby at such points, radio signals are coupled to the coupled patch antenna structure 301 for free-space propagation.

As depicted, the antenna coupling points 306, 308, 310 are positioned at different locations on the coupled patch antenna structure 301. For example, antenna coupling point 306 is located near the edge 315 of patch 302a, while antenna coupling point 308 is located on patch 302b and off-set from the edge 317 of patch 302b by distance x. Further, antenna coupling point 310 is located on patch 302c and off-set from the edge 319 of patch 302c by distance y. Since the coupling points 306, 308, 310 are connected to the coupled patch antenna structure 301, these coupling points 306, 308, 310 are also located within a coplanar surface such as surface P'''. As such, the plurality of patches 302a-302c and the coupling points 306, 308, 310 are all formed on coplanar surface P'''. An exemplary cross-sectional exploded view 314 of coupling point 310 illustrates this further by showing the coupling point 310 as the region or area contacting the undersurface of patch 302c located on surface P″. Thus, the patch 302c and coupling point 210 are located on a common plane.

Although the exemplary coupled patch antenna structure 301 embodiment shows three coupling points 306, 308, 310 and three patches 302a-302c, any number of coupling points distributed across different locations of any plurality patches may be provided for feeding a signal to the antenna structure 301. In operation, as with the grid antenna structure 101 of FIG. 1, receiving a signal at each coupling point generates a different radio propagation direction. This in turn enables the directional transmission of radio signals in predominantly line-of-sight (LOS) communication systems such as MMW systems. As further depicted in FIG. 3, signal transmission diagram 320 illustrates the effect of applying a signal such as a modulated MMW signal to each of coupling points 306, 308, and 310. For example, applying the modulated MMW signal to coupling point 306 generates a MMW radio signal propagation direction 322 having an elevation angle ($\theta''_1$) in the range of about 40-50 degrees. Alternatively, applying the modulated MMW signal to coupling point 308 generates a MMW radio signal radio propagation direction 324 having another elevation angle ($\theta''_2$) in the range of about 85-95 degrees. Further, applying the modulated MMW signal to coupling point 310 generates a MMW radio signal radio propagation direction 326 having yet another elevation angle ($\theta''3$) in the range of about 140-150 degrees. In the depicted example, the MMW radio signal radio propagation directions 322, 324, 326 are within a plane (V″) 330 that is substantially perpendicular to surface P′, on which the coupled patch antenna structure 301 is formed. The coupled patch antenna structure 301 may be designed to operate as either a resonant antenna or as a travelling wave antenna. In either design, the size of the patch elements are, among other things, governed by the required gain and operating frequency of the antenna, and thus vary accordingly.

With reference to the exemplary antenna structures depicted in FIGS. 1-3, sweeping the radio carrier frequency also causes a change in the elevation angle of the propagated radio signal at each coupling point on the antenna. Based on the LOS communication requirements of MMW systems, the above described antenna structures enable high-speed gigabit data communication services between electronic devices by making sure the data modulated MMW radio signals are directionally transmitted from one of the electronic devices to another recipient electronic device (e.g., portable device such as a smart phone). The grid antenna structure of FIG. 1, the series fed patch antenna structure of FIG. 2, and the coupled patch antenna structure of FIG. 3 may be configured to operate within a millimeter-wave band of 57-66 GHz.

Figure 4:
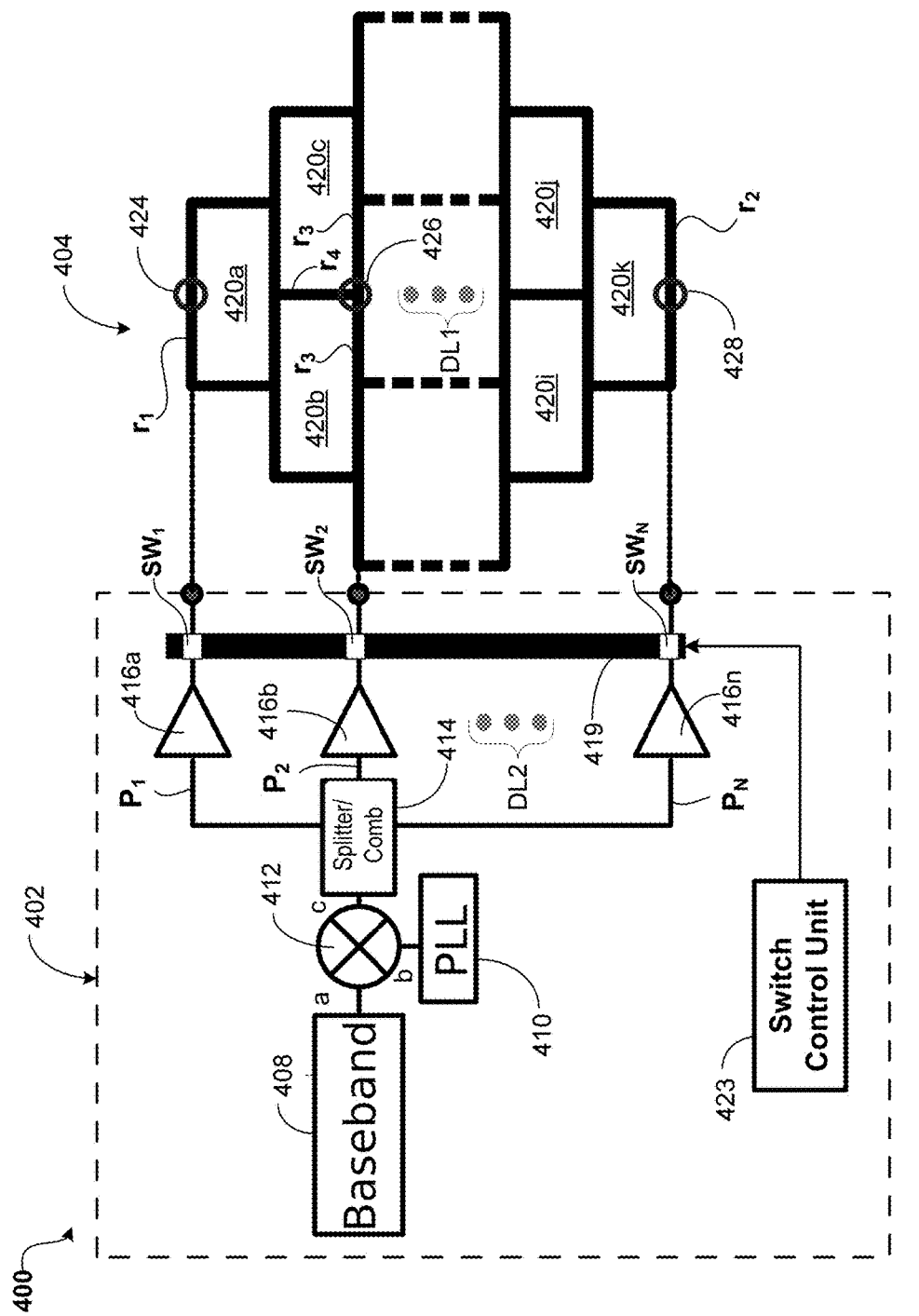
FIG. 4 shows a millimeter-wave (MMW) communication system operating as a transmitter, according to one embodiment.

FIG. 4 shows a millimeter-wave (MMW) communication system 400 operating as a transmitter, according to one embodiment. The exemplary millimeter-wave (MMW) communication system 400 may include a MMW transmitter device 402 and an antenna array structure 404. In the presented example, the antenna array structure 404 includes a grid antenna structure the same as, or similar to, the grid antenna structure depicted in FIG. 1.

As depicted in FIG. 4, the grid antenna structure 404 includes a plurality of loops 420a-420k, whereby, as illustrated by the dashed lines DL1, any number of additional loop structures may be implemented between loops 420b-420c and 420i-420j. The grid antenna structure 404 also includes multiple antenna coupling points 424, 426, 428, whereby at such points, radio signals are coupled to the grid antenna structure 404 for free-space propagation. As depicted, the antenna coupling points 424, 426, 428 are positioned at different locations on the grid antenna structure 404. For example, antenna coupling point 424 is located on an outer radiator element $r_1$ of loop 420a, while antenna coupling point 428 is located on an outer radiator element $r_2$ of loop 420k. Further, antenna coupling point 426 is located at the intersection of radiator elements $r_3$ and $r_4$ corresponding to loops 420b and 420c. Although the exemplary grid antenna structure 404 embodiment shows three coupling points 424, 426, 428, any number of coupling points distributed at different locations may be provided for feeding a signal to the antenna structure 404. In operation, receiving a data modulated signal at each coupling point generates a different radio propagation direction. As previously described, this in turn establishes the MMW system's 400 LOS communication requirements with other MMW devices.

The MMW transmitter device 402 may include a baseband signal generator 408, a millimeter-wave signal generator (e.g., a phase locked loop—PLL) 410, a frequency mixer 412, a power splitter 414 (i.e., also referred to as a power divider), power amplifier devices 416a to 416n, a bank of radio frequency (RF) switches 419, and a switch control unit 423.

In particular, the baseband signal generator 408 provides a source of data (e.g., a High-Definition Video Streaming Service) for radio transmission via the antenna array structure 404. The baseband signal generator 408 may include various digital/analog signal processing capabilities for formatting the data or information prior to up-conversion and subsequent transmission. The millimeter-wave signal generator 410 may further include a tunable PLL MMW signal generator capable of generating signals within, for example, a millimeter-wave band of 57-66 GHz. By applying the output signals from both the baseband signal generator 408 and the millimeter-wave signal generator 410 to the inputs (a, b) of the frequency mixer 412, a data modulated MMW signal is generated at the output (c) of the frequency mixer 412. Since the frequency mixer 412 is coupled to the power splitter 414, the data modulated MMW signal is received at the input of the power splitter 414. The output of the power splitter 414 divides the received data modulated MMW signal along multiple paths $P_1$-$P_N$. Depending on the power splitter (e.g., 2-way, 3-way, 4-way, 8-way, 16-way, etc.), the received data modulated MMW signal may be divided multiple ways. In the illustrated example, the power splitter 414 divides the received data modulated MMW signal along paths $P_1$, $P_2$, and $P_N$. However, as indicated by dashed lines DL2, the received data modulated MMW signal may be divided along a plurality of additional paths (not shown) that may be coupled to other additional coupling points (not shown) on the antenna structure 404.

The data modulated MMW signals divided along paths $P_1$, $P_2$, and $P_N$ are received and amplified by respective power amplifiers 416a, 416b, and 416n. Since the power of the data modulated MMW signal generated from the mixer output (c) is divided by the operation of the power splitter 414, the power amplifiers 416a, 416b, 416n are utilized to restore or increase this reduced power. The amplified data modulated MMW signals at the output of the power amplifiers 416a, 416b, 416n are then received by the bank of radio frequency RF switches 419 coupled to the output of amplifiers 416a, 416b, and 416n. Under the control of switch control unit 423, the actuation of the switches $SW_1$-$SW_N$ within the bank of radio frequency RF switches 419 determines which amplified version of the data modulated MMW signal is coupled to a corresponding one of the coupling points 424, 426, 428.

In operation, for example, by actuating switch $SW_1$ to a closed position, the data modulated MMW signal (i.e., along path $P_1$) that is amplified by amplifier 416a is received at coupling point 424 of the grid antenna structure 404. The amplified data modulated MMW signal received by the grid antenna structure 404 at coupling point 424 is thus radio transmitted at a first propagation direction. By actuating switch $SW_2$ to a closed position, the data modulated MMW signal (i.e., along path $P_2$) that is amplified by amplifier 416b is received at coupling point 426 of the grid antenna structure 404. The amplified data modulated MMW signal received by the grid antenna structure 404 at coupling point 426 is thus radio transmitted at another second propagation direction that is different to the first radio propagation direction. Similarly, by actuating switch $SW_N$ to a closed position, the data modulated MMW signal (i.e., along path $P_N$) that is amplified by amplifier 416n is received at coupling point 428 of the grid antenna structure 404. The amplified data modulated MMW signal received by the grid antenna structure 404 at coupling point 428 is thus radio transmitted at yet another third propagation direction that is different to both the first and the second radio propagation directions.

In a first operating mode, by selectively actuating one of the switches $SW_1$-$SW_N$ within the bank of radio frequency RF switches 419 to a closed position, a predetermined LOS MMW radio transmission at a specific direction may be achieved. For example, the antenna array structure 404 may be integrated onto the outer (top) surface of a table, whereby the actuation of different switches $SW_1$-$SW_N$ within the bank of radio frequency RF switches 419 generates different radio transmission directions that are directed at different specific locations around the table.

Alternatively, in a second operating mode, by selectively actuating all of the switches $SW_1$-$SW_N$ within the bank of radio frequency RF switches 419 to a closed position, a predetermined LOS MMW radio transmission at multiple directions may be achieved (i.e., broadcast mode). For example, the antenna array structure 404 may be integrated onto the outer (top) surface of a table, whereby the actuation of all of the switches $SW_1$-$SW_N$ within the bank of radio frequency RF switches 419 generates different radio transmission directions that are simultaneously directed at multiple specific locations around the table.

Figure 5:
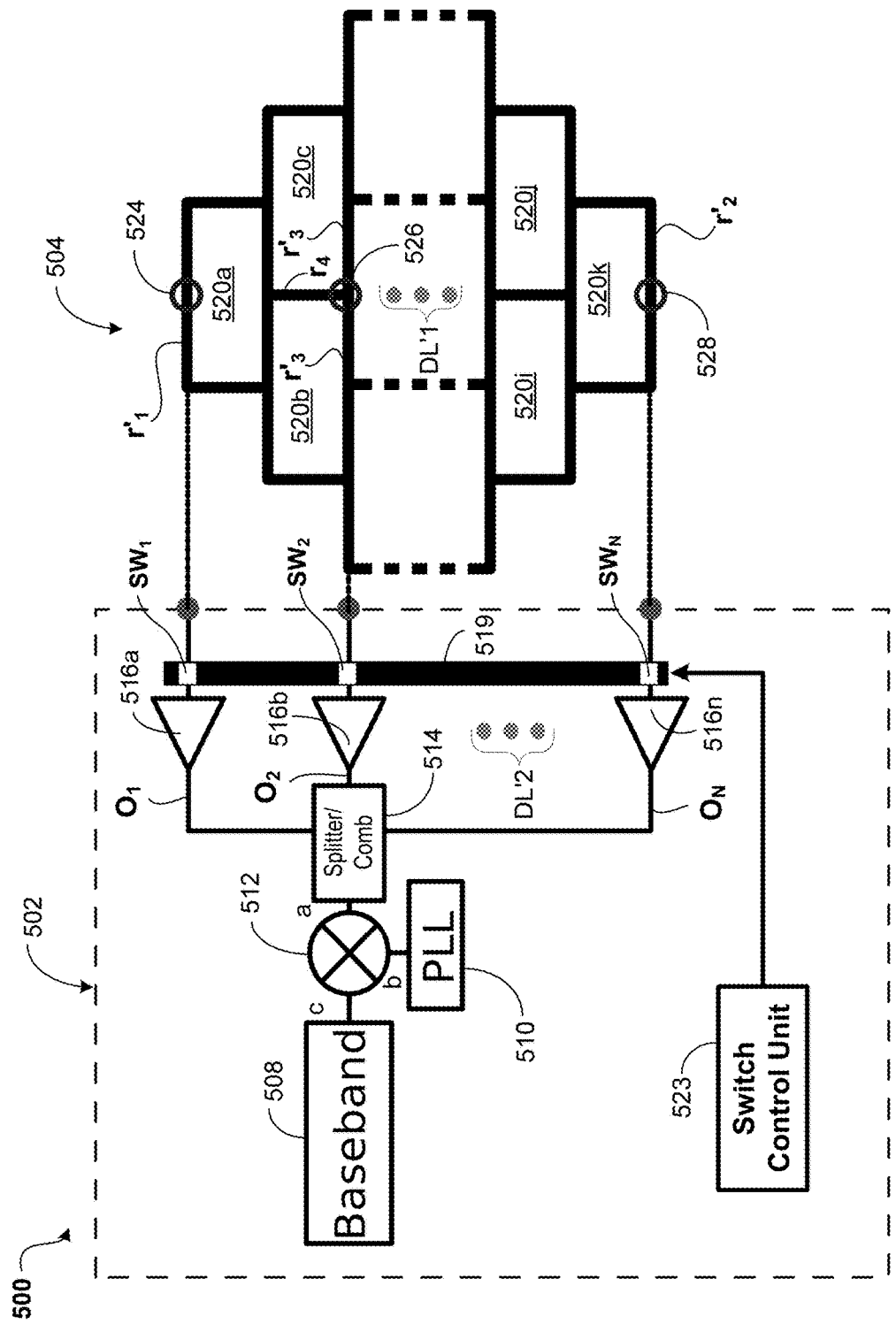
FIG. 5 shows a millimeter-wave (MMW) communication system operating as a receiver, according to one embodiment.

FIG. 5 shows a millimeter-wave (MMW) communication system 500 operating as a receiver, according to one embodiment. The exemplary millimeter-wave (MMW) communication system 500 may include a MMW receiver device 502 and an antenna array structure 504. In the presented example, the antenna array structure 504 includes a grid antenna structure the same as, or similar to, the grid antenna structure depicted in FIG. 1.

As depicted in FIG. 5, the grid antenna structure 504 includes a plurality of loops 520a-520k, whereby, as illustrated by the dashed lines DL'1, any number of additional loop structures may be implemented between loops 520b-520c and 520i-520j. The grid antenna structure 504 also includes multiple antenna coupling points 524, 526, 528, whereby at such points, radio signals are received at the grid antenna structure 504 during free-space radio signal reception. As depicted, the antenna coupling points 524, 526, 528 are positioned at different locations on the grid antenna structure 504. For example, antenna coupling point 524 is located on an outer radiator element $r'_1$ of loop 520a, while antenna coupling point 528 is located on an outer radiator element $r'_2$ of loop 520k. Further, antenna coupling point 526 is located at the intersection of radiator elements $r'_3$ and $r'_4$ corresponding to loops 520b and 520c. Although the exemplary grid antenna structure 504 embodiment shows three coupling points 524, 526, 528, any number of coupling points distributed at different locations may be provided for receiving free-space propagated signals by the antenna structure 504. In operation, data modulated signal are received at each coupling point from different radio propagation directions. As previously described, this in turn establishes the MMW system's 500 LOS communication requirements with other MMW devices.

The MMW receiver device 502 may include a baseband signal receiver 508, a millimeter-wave signal generator (e.g., a phase locked loop—PLL) 510, a frequency mixer 512, a power combiner 514, power amplifier devices 516a to 516n (e.g., low noise amplifiers—LNAs), a bank of radio frequency (RF) switches 519, and a switch control unit 523.

In particular, the baseband signal receiver 508 processes (e.g., demodulation, error correction, clock extraction, etc.) data (e.g., a High-Definition Video Streaming Service) that is received via the antenna array structure 504. The millimeter-wave signal generator 510 may further include a tunable PLL MMW signal generator capable of generating signals within, for example, a millimeter-wave band of 57-66 GHz. By applying the output signals from both the power combiner 514 and the millimeter-wave signal generator 510 to the inputs (a, b) of the frequency mixer 512, a down converted data modulated signal is generated at the output (c) of the frequency mixer 512. As further depicted, the three coupling points 524, 526, 528 of the antenna structure 504 are each coupled to the inputs of the respective power amplifier devices 516a, 516b, 516n via the bank of radio frequency (RF) switches 519. As such, directional LOS data modulated MMW signals are received at the three coupling points 524, 526, 528 based on their signal propagation direction. For example, a data modulated MMW signal transmitted from a first propagation direction is received at coupling point 524, while a data modulated MMW signal transmitted from a second propagation direction is received at coupling point 526. Similarly, according to another example, a data modulated MMW signal transmitted from a third propagation direction is received at coupling point 528.

Based on the operation of the switch control unit 523, the bank of radio frequency (RF) switches 519 couples one or more of the data modulated MMW signals received at the one or more coupling points 524, 526, 528 to a corresponding amplifier 516a, 516b, 516n for signal amplification. For example, based on the actuation of switch $SW_1$ (i.e., $SW_2$ and $SW_N$ unactuated), a data modulated MMW signal received from coupling point 524 along a first LOS propagation direction is coupled to amplifier 516a for signal amplification. Alternatively, according to another example, based on the actuation of switch $SW_2$ (i.e., $SW_1$ and $SW_N$ unactuated), a data modulated MMW signal received from coupling point 526 along a second LOS propagation direction is coupled to amplifier 516b for signal amplification. Further, according to yet another example, based on the actuation of switch $SW_N$ (i.e., $SW_1$ and $SW_2$ unactuated), a data modulated MMW signal received from coupling point 528 along a third LOS propagation direction is coupled to amplifier 516n for signal amplification. The power combiner 514 thus receives one or more of the data modulated MMW signals that have been amplified by power amplifier devices 516a, 516b, and 516n from amplifier outputs $\theta_1$, $\theta_2$, and $\theta_N$. However, as indicated by dashed lines DL'2, the received data modulated MMW signals may be amplified by additional amplifiers (not shown) that are coupled to additional coupling points (not shown) on the antenna structure 504.

In a first operating mode, as described above, by selectively actuating one of the switches $SW_1$-$SW_N$ within the bank of radio frequency RF switches 519 to a closed position, a predetermined LOS MMW radio signal reception at a specific direction may be achieved. For example, the antenna array structure 504 may be integrated onto the outer (top) surface of a table, whereby the actuation of different switches $SW_1$-$SW_N$ within the bank of radio frequency RF switches 419 configures the MMW receiver device 502 to receive different MMW radio signals transmitted from different locations around the table.

Alternatively, in a second operating mode, by selectively actuating all of the switches $SW_1$-$SW_N$ within the bank of radio frequency RF switches 519 to a closed position, a predetermined LOS MMW radio signal reception from multiple directions may be achieved (i.e., broadcast mode). For example, the antenna array structure 504 may be integrated onto the outer (top) surface of a table, whereby the actuation of all of the switches $SW_1$-$SW_N$ within the bank of radio frequency RF switches 519 configures the MMW receiver device 502 to simultaneously receive MMW radio signals transmitted from multiple locations around the table.

In the embodiments depicted in FIGS. 4 and 5, the position of the bank of radio frequency RF switches is functionally represented. Preferably, in FIG. 4, the bank of radio frequency RF switches 419 can be positioned before the amplifiers 416a-416n. In FIG. 5, preferably, the bank of RF switches 519 may be located following the output of amplifiers 516a-516n.

Figure 6:
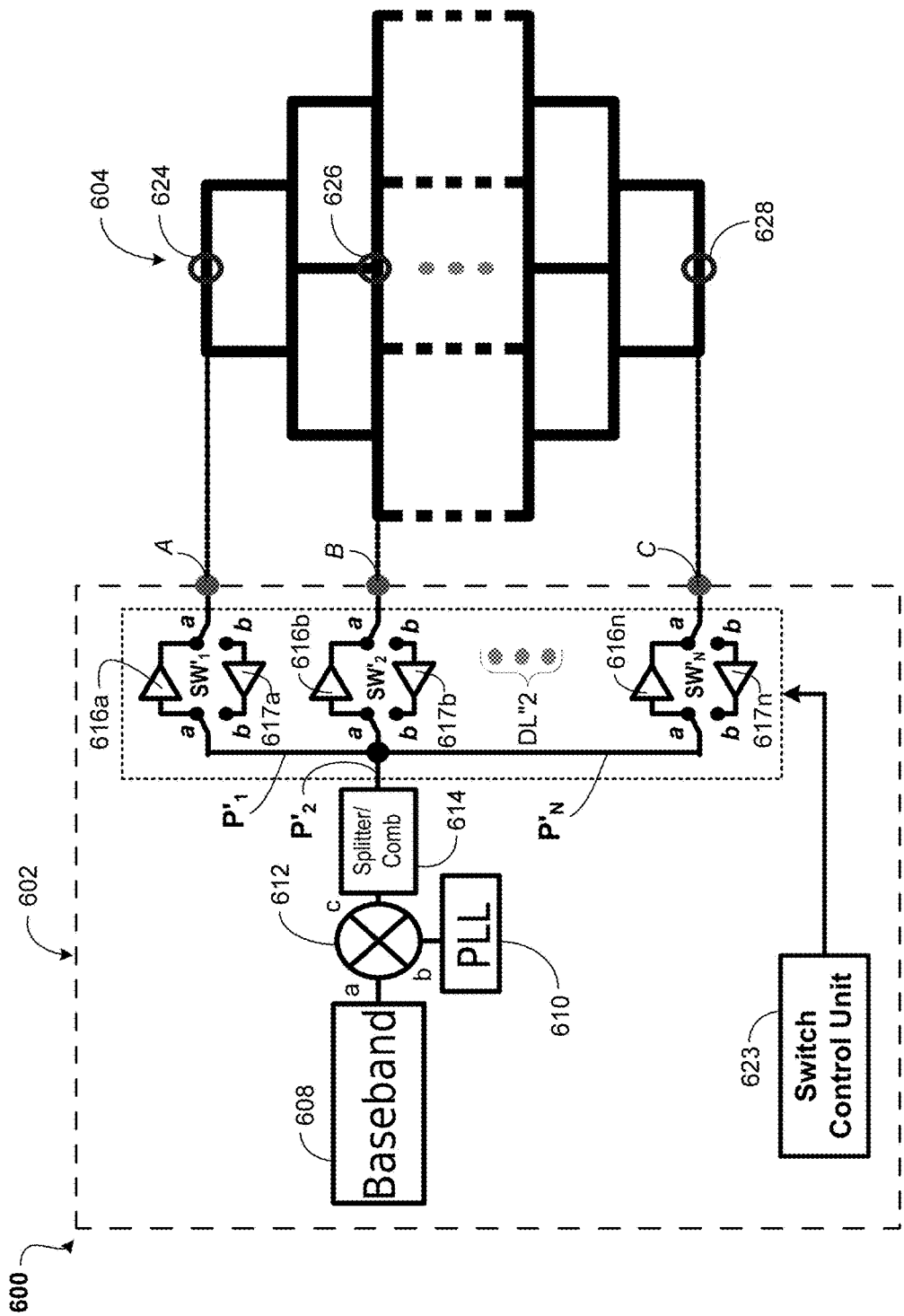
FIG. 6 shows a millimeter-wave (MMW) communication system operating as a transceiver, according to one embodiment.

FIG. 6 shows a millimeter-wave (MMW) communication system 600 operating as a transceiver, according to one embodiment. The exemplary millimeter-wave (MMW) communication system 600 may include a MMW transceiver device 602 and an antenna array structure 604. In the presented example, the antenna array structure 604 includes a grid antenna structure that is the same as, or similar to, the grid antenna structure depicted in FIG. 1.

The MMW transceiver device 602 may include a baseband signal receiver/generator 608, a millimeter-wave signal generator (e.g., a phase locked loop—PLL) 610, a frequency mixer 612, a power splitter/combiner 614, power amplifier devices 616a, 617a, 616b, 617b, 616n, 617n, a bank of radio frequency (RF) switches $SW'_1$, $SW'_2$, $SW'_N$, and a switch control unit 623.

The MMW transceiver device 602 combines the operation of both the MMW transmitter device 402 of FIG. 4 and the MMW receiver device 502 of FIG. 5. Further the antenna array structure 604 is also identical to both the antenna structure 404 of FIG. 4 and the antenna structure 504 of FIG. 5.

In particular, in a transmit mode of operation, the baseband signal receiver/generator 608 provides a source of data (e.g., a High-Definition Video Streaming Service) for radio transmission via the antenna array structure 604. The baseband signal generator 408 may include various digital/analog signal processing capabilities for formatting the data or information prior to up-conversion and subsequent transmission. Alternatively, in a receive mode of operation, the baseband signal receiver/generator 608 processes (e.g., demodulation, error correction, clock extraction, etc.) data (e.g., a High-Definition Video Streaming Service) that is received via the antenna array structure 604.

The millimeter-wave signal generator 610 may include a tunable PLL MMW signal generator capable of generating signals within, for example, a millimeter-wave band of 57-66 GHz. In a transmit mode of operation, by applying the output signals from both the baseband signal receiver/generator 608 and the millimeter-wave signal generator 610 to the inputs (a, b) of the frequency mixer 612, a data modulated MMW signal is generated at the output (c) of the frequency mixer 612. In a receive mode of operation, by applying the output signals from both the power splitter/combiner 614 and the millimeter-wave signal generator 610 to the inputs (b, c) of the frequency mixer 612, a down converted data modulated signal is generated at the output (a) of the frequency mixer 612. It may be appreciated that the mixer input/output terminals are described from the perspective whether signals are being up-converted ($T_x$ mode) or down-converted ($R_x$ mode) by the mixer 612.

The power splitter/combiner 614 operates as power splitter or power combiner depending on the direction of signal travel. Thus, in the transmit mode where the baseband signal receiver/generator 608 produces data for transmission, the power splitter/combiner 614 operates as a power splitter. Alternatively, in the receive mode where the baseband signal receiver/generator 608 demodulates and processes received data, the power splitter/combiner 614 operates as a power combiner.

In the transmit mode, since the frequency mixer 612 is coupled to the power splitter/combiner 614, the data modulated MMW signal is received at the input of the power splitter 614. The output of the power splitter 614 thus divides the received data modulated MMW signal along multiple paths $P'_1$-$P'_N$. Depending on the power splitter (e.g., 2-way, 3-way, 4-way, 8-way, 16-way, etc.), the received data modulated MMW signal may be divided multiple ways. In the illustrated example, the power splitter/combiner 614 divides the received data modulated MMW signal along paths $P'_1$, $P'_2$, and $P'_N$. However, as indicated by dashed lines DL"2, the received data modulated MMW signal may be divided along a plurality of additional paths (not shown) that may be coupled to other additional coupling points (not shown) on the antenna structure 604. As further depicted, the three coupling points 624, 626, 628 of the antenna structure 604 are each coupled to terminals A, B, and C of the bank of radio frequency (RF) switches $SW'_1$, $SW'_2$, and $SW'_N$. In particular, terminal A is coupled to $SW'_1$, terminal B is coupled to $SW'_2$, and terminal C is coupled to $SW'_3$. In the transmit mode of operation, the bank of radio frequency (RF) switches $SW'_1$, $SW'_2$, $SW'_N$ may be configured to switch respective paths $P'_1$, $P'_2$, $P'_N$ through amplifiers 616a, 616b, and 616n.

For example, by actuating switch $SW'_1$ to position 'a', the data modulated MMW signal (i.e., along path $P_1$) that is amplified by amplifier 616a is received at coupling point 624 of the grid antenna structure 604. The amplified data modulated MMW signal received by the grid antenna structure 404 at coupling point 624 is thus radio transmitted at a first propagation direction. By actuating switch SW'2 to position 'a', the data modulated MMW signal (i.e., along path $P_2$) that is amplified by amplifier 616b is received at coupling point 626 of the grid antenna structure 604. The amplified data modulated MMW signal received by the grid antenna structure 604 at coupling point 626 is thus radio transmitted at another second propagation direction that is different to the first radio propagation direction. Similarly, by actuating switch SW'N to position 'a', the data modulated MMW signal (i.e., along path $P_N$) that is amplified by amplifier 616n is received at coupling point 628 of the grid antenna structure 604. The amplified data modulated MMW signal received by the grid antenna structure 604 at coupling point 628 is thus radio transmitted at yet another third propagation direction that is different to both the first and the second radio propagation directions.

In a first operating mode, by selectively actuating one of the switches $SW'_1$-$SW'_N$ to position 'a', a predetermined LOS MMW radio transmission at a specific direction may be achieved. For example, the antenna array structure 604 may be integrated onto the outer (top) surface of a table, whereby the actuation of different switches $SW'_1$-$SW'_N$ to position 'a' configures the transceiver 602 to generate different radio transmission directions that are directed at different specific locations around the table. Alternatively, in a second operating mode, by selectively actuating all of the switches $SW'_1$-$SW'_N$ to position 'a', a predetermined LOS MMW radio transmission at multiple directions may be achieved (i.e., broadcast mode). For example, the antenna array structure 604 may be integrated onto the outer (top) surface of a table, whereby the actuation of all of the switches $SW'_1$-$SW'_N$ to position 'a' configures the transceiver 602 to generate different radio transmission directions that are simultaneously directed at multiple specific locations around the table.

In the receive mode, the three coupling points 624, 626, 628 of the antenna structure 604 are each coupled to the inputs of the respective power amplifier devices 617a, 617b, 617n when switches $SW'_1$-$SW'_N$ are configured to position 'b'. As such, directional LOS data modulated MMW signals are received at the three coupling points 624, 626, 628 based on their signal propagation direction. For example, a data modulated MMW signal transmitted from a first propagation direction is received at coupling point 624, while a data modulated MMW signal transmitted from a second propagation direction is received at coupling point 626. Similarly, according to another example, a data modulated MMW signal transmitted from a third propagation direction is received at coupling point 628.

Based on the operation of the switch control unit 623, the switches $SW'_1$-$SW'_N$ couple one or more of the data modulated MMW signals received at the one or more coupling points 624, 626, 628 to a corresponding amplifier 617a, 617b, 617n for signal amplification. For example, based on the actuation of switch $SW'_1$ to position 'b' (i.e., $SW'_2$ and $SW'_3$ at position 'a'), a data modulated MMW signal received from coupling point 624 along a first LOS propagation direction is coupled to amplifier 617a for signal amplification. Alternatively, according to another example, based on the actuation of switch $SW'_2$ to position 'b' (i.e., $SW'_1$ and $SW'_3$ at position 'a'), a data modulated MMW signal received from coupling point 626 along a second LOS propagation direction is coupled to amplifier 617ba for signal amplification. Further, according to yet another example, based on the actuation of switch $SW'_3$ to position 'b' (i.e., $SW'_1$ and $SW'_2$ at position 'a'), a data modulated MMW signal received from coupling point 628 along a third LOS propagation direction is coupled to amplifier 617n for signal amplification. The power splitter/combiner 614 thus receives one or more of the data modulated MMW signals that have been amplified by power amplifier devices 617a, 617b, and 617n from paths $P'_1$, $P'_2$, and $P'_N$. However, as indicated by dashed lines DL"2, the received data modulated MMW signals may be amplified by additional amplifiers (not shown) that are coupled to additional coupling points (not shown) on the antenna structure 604.

In a first operating mode, as described above, by selectively actuating one of the switches $S'W_1$-$SW'_N$ to position 'b', a predetermined LOS MMW radio signal reception from a specific direction may be achieved. For example, the antenna array structure 604 may be integrated onto the outer (top) surface of a table, whereby the actuation of different switches $SW'_1$-$SW'_N$ to position 'b' configures the MMW transceiver device 602 to receive different MMW radio signals transmitted from different locations around the table. Alternatively, in a second operating mode, by selectively actuating all of the switches $SW'_1$-$SW'_N$ to position 'b', a predetermined LOS MMW radio signal reception from multiple directions may be achieved (i.e., broadcast mode). For example, the antenna array structure 604 may be integrated onto the outer (top) surface of a table, whereby the actuation of all of the switches $SW'_1$-$SW'_N$ to position 'b' configures the MMW transceiver device 502 to simultaneously receive MMW radio signals transmitted from multiple locations around the table.

Figure 7:
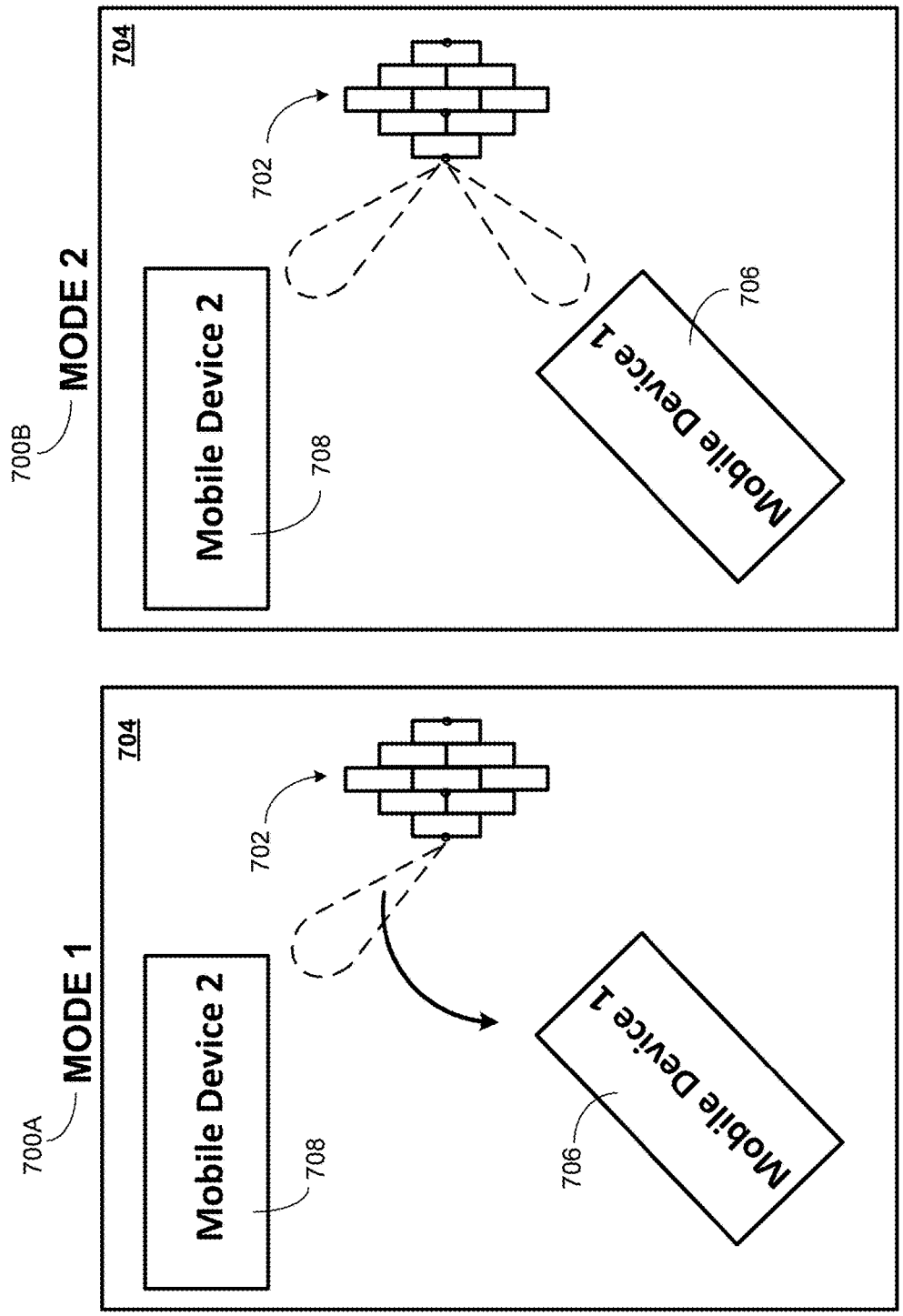
FIG. 7 shows operational modes associated with the millimeter-wave (MMW) communication systems of FIGS. 4-6, according to one embodiment.

FIG. 7 shows operational modes associated with the millimeter-wave (MMW) communication systems of FIGS. 4-6, according to one embodiment. As depicted, an antenna array structure 702 may be located on a surface 704 of, for example, a table, a mobile device (e.g., smartphone) display or housing, or other device surface. The antenna array structure 702 may also be coupled to any communication device identical to, or similar to, those depicted and described in relation to FIGS. 4-6. Moreover, the antenna array structure 702 may communicate with mobile devices 706 and 708, whereby each of the mobile devices 706, 708 include an identical or similar communication system to those depicted and described in relation to the MMW systems of FIGS. 4-6.

In a first mode of operation 700A, the antenna array structure 702 may direct LOS communications to a target device. For example, as described in the foregoing, utilizing a first coupling point on the antenna array structure 702 in a transmit mode, a data modulated MMW signal is transmitted at a first propagation direction to mobile device 708. Alternatively, by using another coupling point on the antenna array structure 702, a data modulated MMW signal is transmitted at a second propagation direction to mobile device 706. Although for illustrative brevity only two mobile devices 706, 708 and two propagation directions are described, multiple coupling points on the antenna array structure 702 may be utilized in a manner that facilitates generating LOS signal transmissions to multiple mobile devices located in the periphery of surface 704.

Moreover, utilizing the first coupling point on the antenna array structure 702 in a receive mode, a data modulated MMW signal is received at a first propagation direction from mobile device 708. Alternatively, by using another coupling point on the antenna array structure 702, a data modulated MMW signal is received at a second propagation direction from mobile device 706. Although for illustrative brevity only two mobile devices 706, 708 and two propagation directions are described, multiple coupling points on the antenna array structure 702 may be utilized in a manner that facilitates receiving LOS signal transmissions from multiple mobile devices located in the periphery of surface 704.

In a second mode of operation 700B, the antenna array structure 702 may simultaneously direct LOS communications (i.e., broadcast) to multiple target devices. For example, as described in the foregoing, utilizing a first and a second coupling point on the antenna array structure 702 in a transmit mode, a data modulated MMW signal is transmitted at both a first and a second propagation direction to mobile devices 706 and 708. Although for illustrative brevity only two mobile devices 706, 708 and two propagation directions are described, multiple coupling points on the antenna array structure 702 may be utilized in a manner that facilitates generating LOS signal transmissions to multiple mobile devices located in the periphery of surface 704.

Moreover, utilizing the first and the second coupling point on the antenna array structure 702 in a receive mode, a data modulated MMW signal is received at a first propagation direction from mobile device 708, while alternatively, using the other coupling point on the antenna array structure 702, a data modulated MMW signal is received at a second propagation direction from mobile device 706. Although for illustrative brevity only two mobile devices 706, 708 and two propagation directions are described, multiple coupling points on the antenna array structure 702 may be utilized in a manner that facilitates receiving LOS signal transmissions from multiple mobile devices located in the periphery of surface 704.

Figure 8:
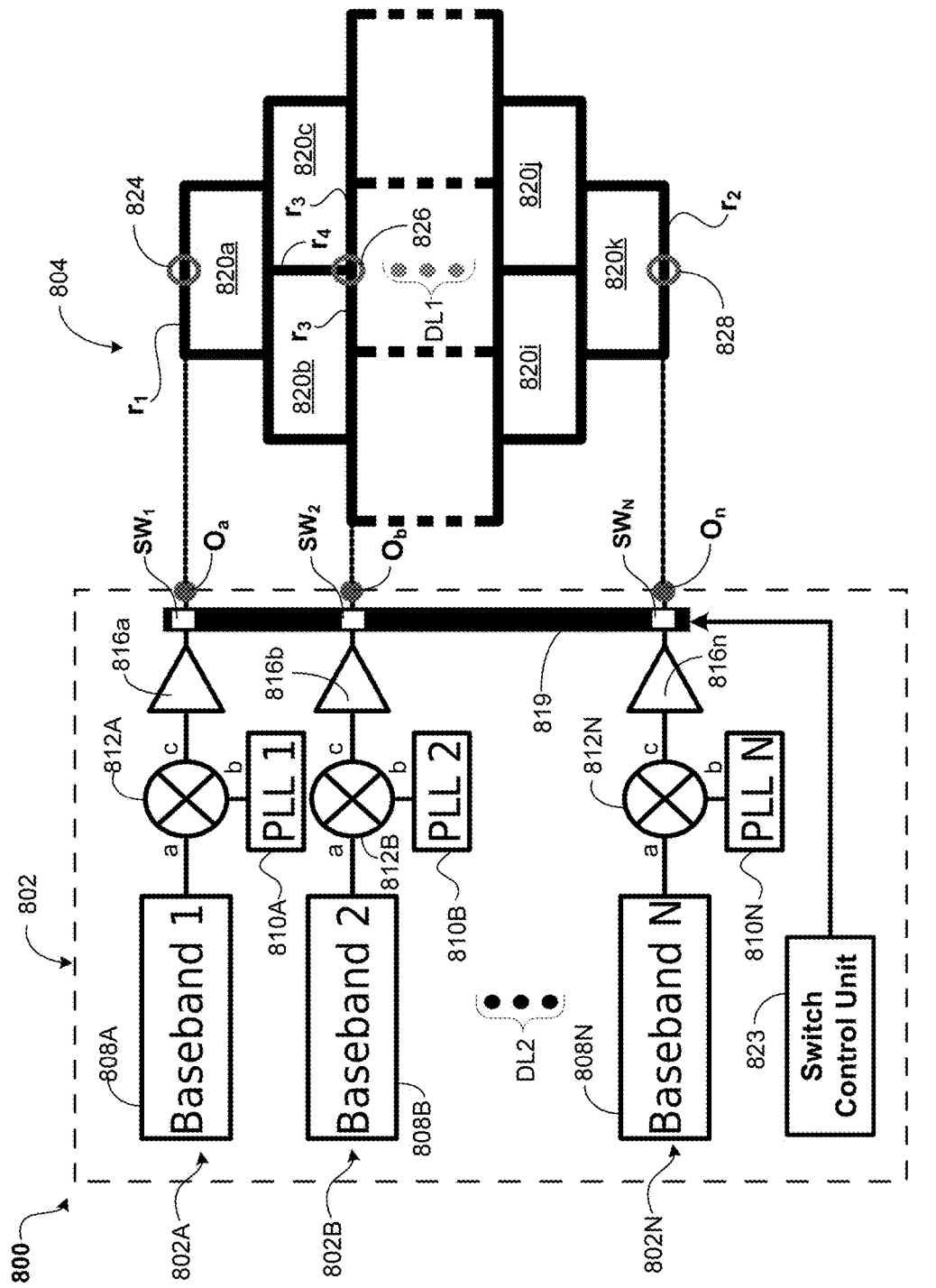
FIG. 8 shows a millimeter-wave (MMW) communication system operating as a transmitter, according to another embodiment.

FIG. 8 shows a millimeter-wave (MMW) communication system 800 operating as a transmitter, according to another alternative embodiment. The exemplary millimeter-wave (MMW) communication system 800 may include a MMW transmitter device 802 and an antenna array structure 804. In the presented example, the antenna array structure 804 includes a grid antenna structure the same as, or similar to, grid antenna structure 404 depicted in FIG. 4. Moreover, the MMW transmitter device 802 includes multiple MMW transmitter devices 802A, 802B, 802N that each have components that are identical to MMW transmitter device 402 depicted in FIG. 4.

As depicted in FIG. 8, the grid antenna structure 804 includes a plurality of loops 820a-820k, whereby, as illustrated by the dashed lines DL1, any number of additional loop structures may be implemented between loops 820b-820c and 820i-820j. The grid antenna structure 804 also includes multiple antenna coupling points 824, 826, 828, whereby at such points, radio signals are coupled to the grid antenna structure 804 for free-space propagation. As depicted, the antenna coupling points 824, 826, 828 are positioned at different locations on the grid antenna structure 804. For example, antenna coupling point 824 is located on an outer radiator element $r_1$ of loop 820a, while antenna coupling point 828 is located on an outer radiator element $r_2$ of loop 820k. Further, antenna coupling point 826 is located at the intersection of radiator elements $r_3$ and $r_4$ corresponding to loops 820b and 820c. Although the exemplary grid antenna structure 804 embodiment shows three coupling points 824, 826, 828, any number of coupling points distributed at different locations (e.g., between dashed line DL1) may be provided for feeding a signal to the antenna structure 804. In operation, receiving a data modulated signal at each coupling point generates a different radio propagation direction. As previously described, this in turn establishes the MMW system's 800 LOS communication requirements with other MMW devices.

In this alternative embodiment, each of MMW transmitter devices 802a, 802b and 802n is coupled to respective coupling point 824, 826, and 828. More specifically, MMW transmitter device 802A is coupled to coupling point 824, MMW transmitter device 802B is coupled to coupling point 826, and MMW transmitter device 802N is coupled to coupling point 828. Thus, different data from different transmitter devices may be communicated over directional MMW channels to intended recipients.

Within MMW transmitter device 802, MMW transmitter device 802A may include baseband signal generator 808A, millimeter-wave signal generator (e.g., a phase locked loop—PLL) 810A, frequency mixer 812A, and power amplifier device 816a. Also, MMW transmitter device 802B may include baseband signal generator 808B, millimeter-wave signal generator (e.g., a phase locked loop—PLL) 810B, frequency mixer 812B, and power amplifier device 816b. Similarly, MMW transmitter device 802N may include baseband signal generator 808N, millimeter-wave signal generator (e.g., a phase locked loop—PLL) 810N, frequency mixer 812N, and power amplifier device 816n. Further, MMW transmitter device 802 also includes a bank of radio frequency (RF) switches 819 and a switch control unit 823. Each of MMW transmitter devices 802A, 802b, and 802N are coupled to respective coupling points 824, 826, and 828 via the bank of RF switches 819, whereby the RF switches 819 are controlled by switch control unit 823.

Within MMW transmitter device 802A, baseband signal generator 808A provides a source of data (e.g., a High-Definition Video Streaming Service) for radio transmission via the antenna array structure 804. The baseband signal generator 808A may include various digital/analog signal processing capabilities for formatting the data or information prior to up-conversion and subsequent transmission. The millimeter-wave signal generator 810A may further include a tunable PLL MMW signal generator capable of generating signals within, for example, a millimeter-wave band of 57-66 GHz. By applying the output signals from both the baseband signal generator 808A and the millimeter-wave signal generator 810A to the inputs (a, b) of the frequency mixer 812A, a first data modulated MMW signal is generated at the output (c) of the frequency mixer 812A. The first data modulated MMW signal is received and amplified by power amplifier 816a. The amplified first data modulated MMW signal at the output of the power amplifier 816a is then received by the bank of radio frequency RF switches 819 coupled to the output of amplifier 816a. Under the control of switch control unit 823, the actuation of the switches $SW_1$-$SW_N$ within the bank of radio frequency RF switches 819 determines which amplified data modulated MMW signal is coupled to a corresponding one of the coupling points 824, 826, 828. For example, by actuating switch $SW_1$ of the bank of radio frequency RF switches 819 to a closed position, the amplified first data modulated MMW signal is coupled to coupling point 824.

Within MMW transmitter device 802B, baseband signal generator 808 B provides a source of data (e.g., a High-Definition Video Streaming Service) for radio transmission via the antenna array structure 804. The baseband signal generator 808B may include various digital/analog signal processing capabilities for formatting the data or information prior to up-conversion and subsequent transmission. The millimeter-wave signal generator 810B may further include a tunable PLL MMW signal generator capable of generating signals within, for example, a millimeter-wave band of 57-66 GHz. By applying the output signals from both the baseband signal generator 808B and the millimeter-wave signal generator 810B to the inputs (a, b) of the frequency mixer 812B, a second data modulated MMW signal is generated at the output (c) of the frequency mixer 812B. The second data modulated MMW signal is received and amplified by power amplifier 816b. The amplified second data modulated MMW signal at the output of the power amplifier 816b is then received by the bank of radio frequency RF switches 819 coupled to the output of amplifier 816b. Under the control of switch control unit 823, the actuation of the switches $SW_1$-$SW_N$ within the bank of radio frequency RF switches 819 determines which amplified data modulated MMW signal is coupled to a corresponding one of the coupling points 824, 826, 828. For example, by actuating switch $SW_2$ of the bank of radio frequency RF switches 819 to a closed position, the amplified second data modulated MMW signal is coupled to coupling point 826.

Within MMW transmitter device 802N, baseband signal generator 808N provides a source of data (e.g., a High-Definition Video Streaming Service) for radio transmission via the antenna array structure 804. The baseband signal generator 808N may include various digital/analog signal processing capabilities for formatting the data or information prior to up-conversion and subsequent transmission. The millimeter-wave signal generator 810N may further include a tunable PLL MMW signal generator capable of generating signals within, for example, a millimeter-wave band of 57-66 GHz. By applying the output signals from both the baseband signal generator 808N and the millimeter-wave signal generator 810N to the inputs (a, b) of the frequency mixer 812N, a third data modulated MMW signal is generated at the output (c) of the frequency mixer 812N. The third data modulated MMW signal is received and amplified by power amplifier 816n. The amplified third data modulated MMW signal at the output of the power amplifier 816n is then received by the bank of radio frequency RF switches 819 coupled to the output of amplifier 816n. Under the control of switch control unit 823, the actuation of the switches $SW_1$-$SW_N$ within the bank of radio frequency RF switches 819 determines which amplified data modulated MMW signal is coupled to a corresponding one of the coupling points 824, 826, 828. For example, by actuating switch $SW_N$ of the bank of radio frequency RF switches 819 to a closed position, the amplified third data modulated MMW signal is coupled to coupling point 828.

As depicted by dashed line DL2, any number of MMW transmitter devices may be coupled to any number of corresponding antenna coupling points. Thus, different sources of data can be directionally transmitted based on which coupling point is being utilized. For example, baseband signal generator 808A may include data that is transmitted at a first propagation direction when coupled to coupling point 824. Also, baseband signal generator 808B may include data that is transmitted at a second propagation direction when coupled to coupling point 826, while baseband signal generator 808N may include data that is transmitted at a third propagation direction when coupled to coupling point 828. In some implementations, the bank of radio frequency RF switches 819 may incorporate a switch fabric architecture, whereby the output of the amplifiers 816a-816n can be electrically connected to any one of the outputs $O_a$-$O_n$. For example, switch control unit 823 could connect the output of amplifier 816a to output $O_b$ and thus coupling point 826. Moreover, switch control unit 823 could alternatively connect the output of amplifier 816a to output $O_n$ and thus coupling point 828. Such a switch implementation thus provides each MMW transmitter device with the capability of directionally transmitting data to an intended recipient device. According to another implementation, the architecture depicted in FIG. 8 may also facilitate multiple-input and multiple-output (MIMO) communication capabilities.

Figure 9:
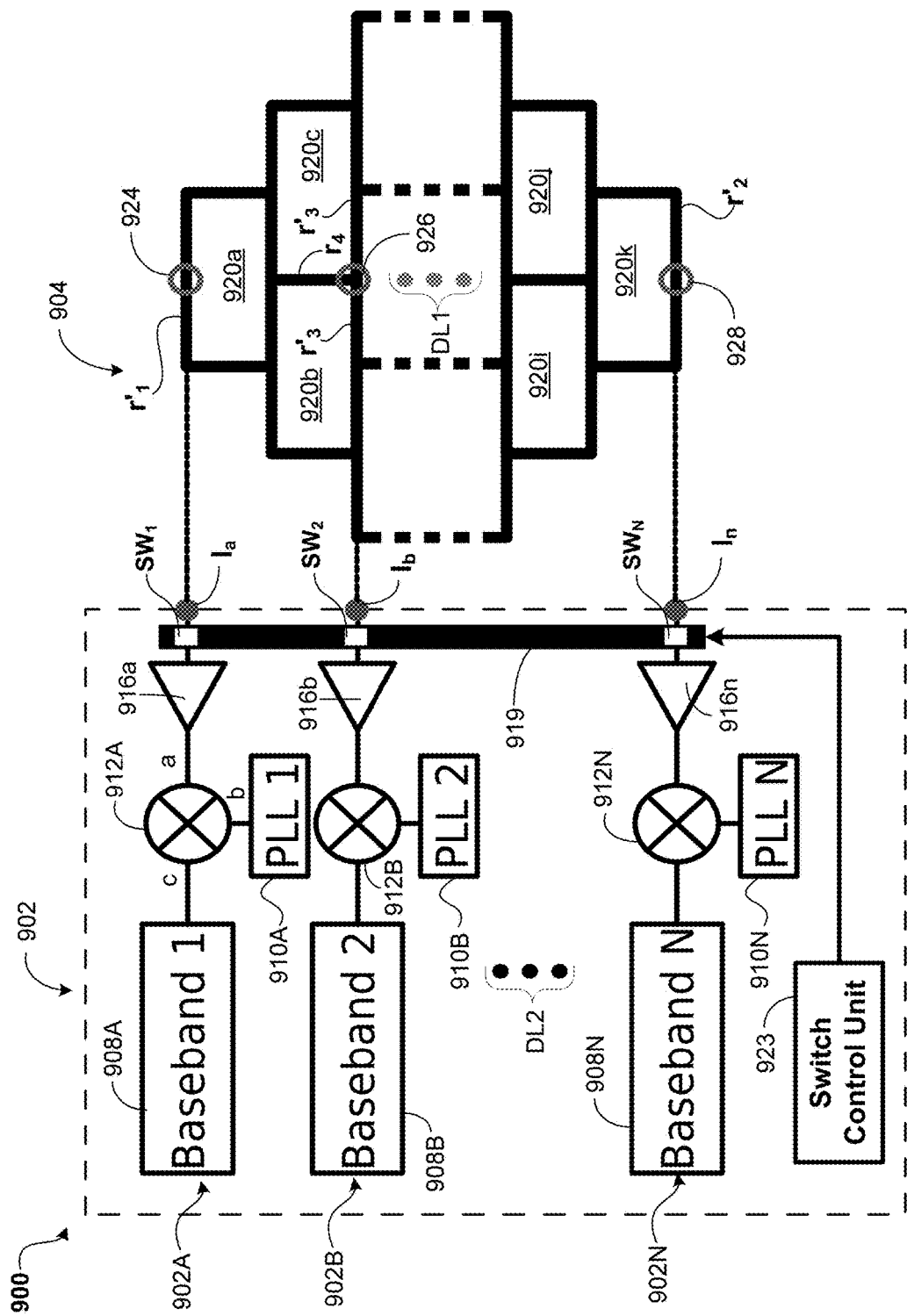
FIG. 9 shows a millimeter-wave (MMW) communication system operating as a receiver, according to another embodiment.

FIG. 9 shows a millimeter-wave (MMW) communication system 900 operating as a receiver, according to another alternative embodiment. The exemplary millimeter-wave (MMW) communication system 900 may include a MMW receiver device 902 and an antenna array structure 904. In the presented example, the antenna array structure 904 includes a grid antenna structure the same as, or similar to, grid antenna structure 504 depicted in FIG. 5. Moreover, the MMW receiver device 902 includes multiple MMW receiver devices 902A, 902B, 902N that each have components that are identical to MMW receiver device 502 depicted in FIG. 5.

Accordingly, as depicted in FIG. 9, the grid antenna structure 904 includes a plurality of loops 920a-920k, whereby, as illustrated by the dashed lines DL1, any number of additional loop structures may be implemented between loops 920b-920c and 920i-920j. The grid antenna structure 904 also includes multiple antenna coupling points 924, 926, 928, whereby at such points, radio signals are received by the grid antenna structure 904 during free-space radio signal reception. As depicted, the antenna coupling points 924, 926, 928 are positioned at different locations on the grid antenna structure 904. For example, antenna coupling point 924 is located on an outer radiator element $r'_1$ of loop 920a, while antenna coupling point 928 is located on an outer radiator element $r'_2$ of loop 920k. Further, antenna coupling point 926 is located at the intersection of radiator elements $r'_3$ and $r'_4$ corresponding to loops 920b and 920c. Although the exemplary grid antenna structure 904 embodiment shows three coupling points 924, 926, 928, any number of coupling points distributed at different locations (e.g., between dashed line DL1) may be provided for feeding a signal to the antenna structure 904. In operation, each coupling point receives a data modulated signal from a different radio propagation direction. As previously described, this in turn establishes the MMW system's 900 LOS communication requirements with other MMW devices.

In this alternative embodiment, each of MMW receiver devices 902A, 902B and 902N is coupled to respective coupling point 924, 926, and 928. More specifically, MMW receiver device 902A is coupled to coupling point 924, MMW receiver device 902B is coupled to coupling point 926, and MMW receiver device 902N is coupled to coupling point 928. Thus, data from different intended recipients may be received over directional MMW channels.

Within MMW receiver device 902, MMW receiver device 902A may include baseband signal receiver 908A, millimeter-wave signal generator (e.g., a phase locked loop—PLL) 910A, frequency mixer 912A, and power amplifier device 916a (e.g., low noise amplifier—LNA). Also, MMW receiver device 902B may include baseband signal receiver 908B, millimeter-wave signal generator (e.g., a phase locked loop—PLL) 910B, frequency mixer 912B, and power amplifier device 916b (e.g., LNA). Similarly, MMW receiver device 902N may include baseband signal receiver 908N, millimeter-wave signal generator (e.g., a phase locked loop—PLL) 910N, frequency mixer 912N, and power amplifier device 916n (e.g., LNA). Further, MMW receiver device 902 also includes a bank of radio frequency (RF) switches 919 and a switch control unit 823. Each of coupling points 924, 926, and 928 are coupled to respective MMW receiver devices 902A, 902b, and 902N via the bank of RF switches 919, whereby the RF switches 919 are controlled by switch control unit 823.

Within MMW receiver device 902A, baseband signal receiver 908A processes (e.g., demodulation, error correction, clock extraction, etc.) data (e.g., a High-Definition Video Streaming Service) that is received via the antenna array structure 904. The baseband signal receiver 908A may include various digital/analog signal processing capabilities following the down-conversion of a received MMW radio signal by mixer 912A. The millimeter-wave signal generator 910A may further include a tunable PLL MMW signal generator capable of generating signals within, for example, a millimeter-wave band of 57-66 GHz. By applying the output signals from both the power amplifier 916a and the millimeter-wave signal generator 910A to the inputs (a, b) of the frequency mixer 912A, a first down converted data modulated signal is generated at the output (c) of the frequency mixer 912A.

Also, for MMW receiver device 902B, baseband signal receiver 908B processes (e.g., demodulation, error correction, clock extraction, etc.) data (e.g., a High-Definition Video Streaming Service) that is received via the antenna array structure 904. The baseband signal receiver 908B may include various digital/analog signal processing capabilities following the down-conversion of a received MMW radio signal by mixer 912B. The millimeter-wave signal generator 910B may further include a tunable PLL MMW signal generator capable of generating signals within, for example, a millimeter-wave band of 57-66 GHz. By applying the output signals from both power amplifier 916b and millimeter-wave signal generator 910B to the inputs (a, b) of the frequency mixer 912B, a second down converted data modulated signal is generated at the output (c) of the frequency mixer 912B.

Similarly, for MMW receiver device 902N, baseband signal receiver 908N also processes (e.g., demodulation, error correction, clock extraction, etc.) data (e.g., a High-Definition Video Streaming Service) that is received via the antenna array structure 904. The baseband signal receiver 908N may include various digital/analog signal processing capabilities following the down-conversion of a received MMW radio signal by mixer 912N. The millimeter-wave signal generator 910N may further include a tunable PLL MMW signal generator capable of generating signals within, for example, a millimeter-wave band of 57-66 GHz. By applying the output signals from both power amplifier 916n and millimeter-wave signal generator 910N to the inputs (a, b) of the frequency mixer 912N, a third down converted data modulated signal is generated at the output (c) of the frequency mixer 912N.

Under the control of switch control unit 923, the actuation of the switches $SW_1$-$SW_N$ within the bank of radio frequency RF switches 919 determines which data modulated MMW radio signals are received at a corresponding one of the MMW receiver devices 902A, 902B, 902N. For example, by actuating switch $SW_1$ of the bank of radio frequency RF switches 919 to a closed position, a first data modulated MMW radio signal from a first propagation direction is coupled from coupling point 924 to MMW receiver devices 902A. Alternatively, by actuating switch $SW_2$ of the bank of radio frequency RF switches 919 to a closed position, a second data modulated MMW radio signal from a second propagation direction is coupled from coupling point 926 to MMW receiver devices 902B. Further, by actuating switch $SW_N$ of the bank of radio frequency RF switches 819 to a closed position, a third data modulated MMW radio signal from a third propagation direction is coupled from coupling point 828 to MMW receiver devices 902N.

As depicted by dashed line DL2, any number of MMW receiver devices may be coupled to any number of corresponding antenna coupling points. Thus, different MMW radio signals can be directionally received based on which coupling point is being utilized. For example, baseband signal receiver 908A may receive data that is transmitted from a first propagation direction via coupling point 924. Also, baseband signal receiver 908B may receive data that is transmitted from a second propagation direction via coupling point 926, while baseband signal receiver 908N may receive data that is transmitted from a third propagation direction via coupling point 928. In some implementations, the bank of radio frequency RF switches 919 may incorporate a switch fabric architecture, whereby any one of the inputs $I_a$-$I_n$ can be electrically connected to the input of the amplifiers 916a-916n. For example, switch control unit 923 could connect input $I_b$ and thus coupling point 926 to the input of amplifier 916a. Moreover, switch control unit 923 could alternatively connect input $I_b$ and thus coupling point 926 to the input of amplifier 916n. Such a switch implementation thus provides each MMW receiver device with the capability of directionally receiving data from an intended recipient device. According to another implementation, the architecture depicted in FIG. 9 may also facilitate multiple-input and multiple-output (MIMO) communication capabilities.

It may be appreciated that while MMW radio signals propagating from multiple directions are received at each coupling point associated with the antenna array structure, sufficient signal strength for MMW receiver detection is based on each coupling point's sensitivity to a particular signal propagation direction. As such, although several radio signals from different directions may be incident at a given coupling point, one of the several radio signals received from a particular direction will be detectable.

In the embodiments depicted in FIGS. 8 and 9, the position of the bank of radio frequency RF switches is functionally represented. Preferably, in FIG. 8, the bank of radio frequency RF switches 819 can be positioned before the amplifiers 816a-816n. In FIG. 9, preferably, the bank of RF switches 919 may be located following the output of amplifiers 916a-916n.

Figure 10:
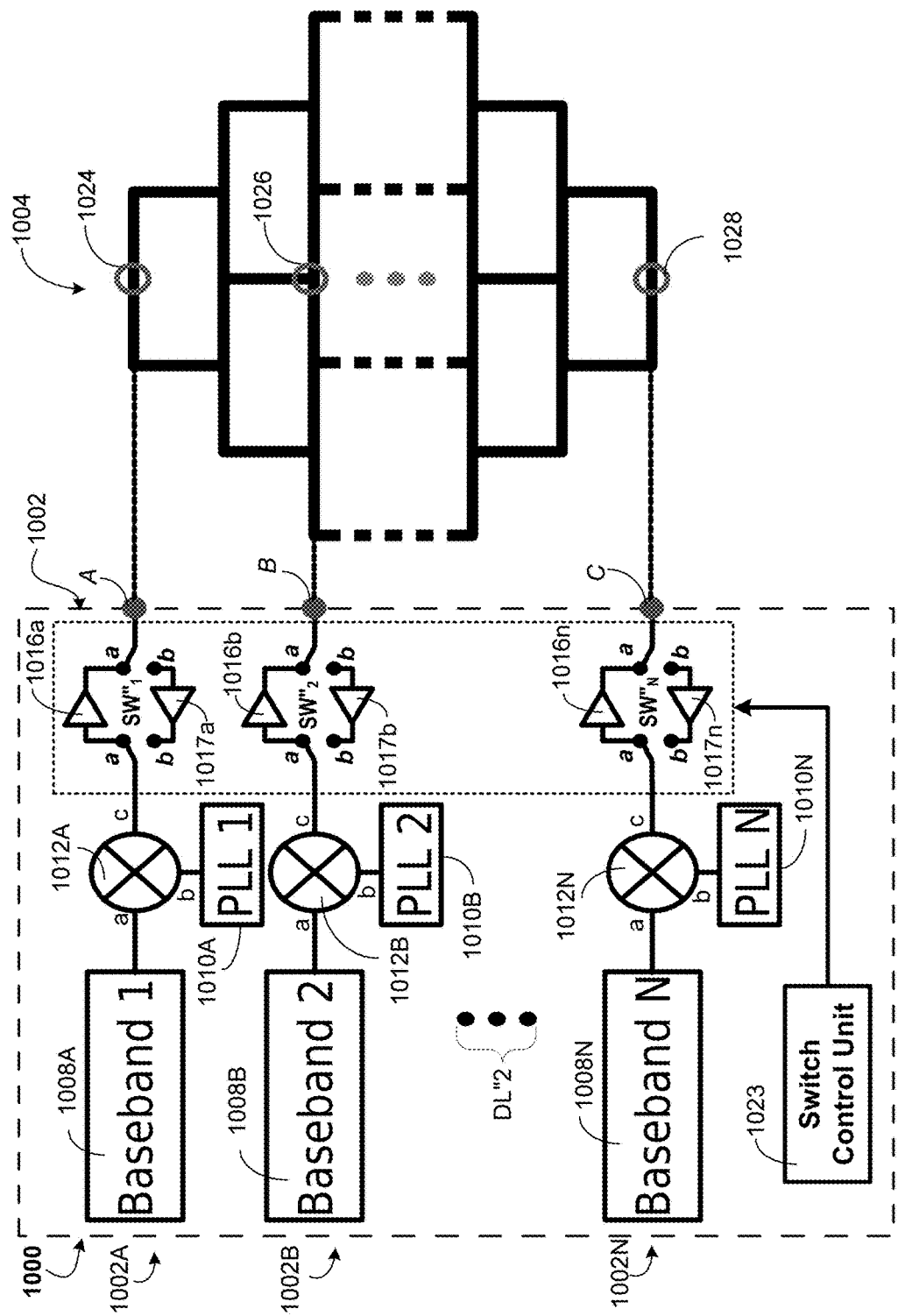
FIG. 10 shows a millimeter-wave (MMW) communication system operating as a transceiver, according to another embodiment.

FIG. 10 shows a millimeter-wave (MMW) communication system 1000 operating as a transceiver, according to another embodiment. The exemplary millimeter-wave (MMW) communication system 1000 may include a MMW transceiver device 1002 and an antenna array structure 1004. In the presented example, the antenna array structure 1004 includes a grid antenna structure that is the same as, or similar to, the grid antenna structure depicted in FIG. 6. Moreover, the MMW transceiver device 1002 includes multiple MMW transceiver devices 1002A, 1002B, 1002N that each have components that are identical to MMW transceiver device 602 depicted in FIG. 6. MMW transceiver device 1002 may further include a switch control unit 1023.

MMW transceiver device 1002A may include a baseband signal receiver/generator 1008A, a millimeter-wave signal generator (e.g., a phase locked loop—PLL) 1010A, a frequency mixer 1012A, power amplifier devices 1016a and 1017a, and radio frequency (RF) switch $SW''_1$. Accordingly, MMW transceiver device 1002B may include baseband signal receiver/generator 1008B, millimeter-wave signal generator (e.g., a phase locked loop—PLL) 1010B, frequency mixer 1012B, power amplifier devices 1016b and 1017b, and radio frequency (RF) switch $SW''_2$. Similarly, MMW transceiver device 1002N may include baseband signal receiver/generator 1008N, millimeter-wave signal generator (e.g., a phase locked loop—PLL) 1010N, frequency mixer 1012N, power amplifier devices 1016n and 1017n, and radio frequency (RF) switch $SW''_n$.

The MMW transceiver device 1002 combines the operation of both the MMW transmitter device 802 of FIG. 8 and the MMW receiver device 902 of FIG. 9. Further the antenna array structure 1004 is also identical to both the antenna structure 804 of FIG. 8 and the antenna structure 904 of FIG. 9.

In particular, in a transmit mode of operation, each of the baseband signal receivers/generators 1008A, 1008B, 1008N provide a source of data (e.g., a High-Definition Video Streaming Service) for radio transmission via the antenna array structure 1004. The baseband signal receivers/generators 1008A, 1008B, 1008N may include various digital/analog signal processing capabilities for formatting the data or information prior to up-conversion and subsequent transmission. Alternatively, in a receive mode of operation, the baseband signal receivers/generators 1008A, 1008B, 1008N process (e.g., demodulation, error correction, clock extraction, etc.) data (e.g., a High-Definition Video Streaming Service) that is received via the antenna array structure 1004.

Within MMW transceiver 1002A, the millimeter-wave signal generator 1010A may include a tunable PLL MMW signal generator capable of generating signals within, for example, a millimeter-wave band of 57-66 GHz. In a transmit mode of operation, by applying the output signals from both the baseband signal receiver/generator 1008A and the millimeter-wave signal generator 1010A to the inputs (a, b) of the frequency mixer 1012A, a first data modulated MMW signal is generated at output (c) of the frequency mixer 1012A. In a receive mode of operation, by applying the output signal from the power amplifier 1017a and the millimeter-wave signal generator 1010A to the inputs (b, c) of the frequency mixer 1012A, a first down converted data modulated signal is generated at output (b) of the frequency mixer 1012A. Accordingly, the mixer input/output terminals are described from the perspective of whether signals are being up-converted ($T_x$ mode) or down-converted ($R_x$ mode) by the mixer 1012A.

Within MMW transceiver 1002B, millimeter-wave signal generator 1010B may include a tunable PLL MMW signal generator capable of generating signals within, for example, a millimeter-wave band of 57-66 GHz. In a transmit mode of operation, by applying the output signals from both baseband signal receiver/generator 1008B and millimeter-wave signal generator 1010B to the inputs (a, b) of frequency mixer 1012B, a second data modulated MMW signal is generated at output (c) of the frequency mixer 1012B. In a receive mode of operation, by applying the output signal from power amplifier 1017b and millimeter-wave signal generator 1010B to the inputs (b, c) of frequency mixer 1012B, a second down converted data modulated signal is generated at output (b) of the frequency mixer 1012B. Accordingly, the mixer input/output terminals are described from the perspective of whether signals are being up-converted ($T_x$ mode) or down-converted ($R_x$ mode) by the mixer 1012B.

Similarly, within MMW transceiver 1002N, millimeter-wave signal generator 1010N may include a tunable PLL MMW signal generator capable of generating signals within, for example, a millimeter-wave band of 57-66 GHz. In a transmit mode of operation, by applying the output signals from both baseband signal receiver/generator 1008N and millimeter-wave signal generator 1010N to the inputs (a, b) of frequency mixer 1012N, a third data modulated MMW signal is generated at output (c) of the frequency mixer 1012N. In a receive mode of operation, by applying the output signal from power amplifier 1017n and millimeter-wave signal generator 1010N to the inputs (b, c) of frequency mixer 1012N, a third down converted data modulated signal is generated at output (b) of the frequency mixer 1012N. Accordingly, the mixer input/output terminals are described from the perspective of whether signals are being up-converted ($T_x$ mode) or down-converted ($R_x$ mode) by the mixer 1012N.

In the transmit mode, data that is to be transmitted is up-converted to a MMW carrier frequency, amplified, and radio transmitted via the antenna array structure. In the embodiment depicted in FIG. 10, each of the MMW transceiver devices 1002A-1002N within MMW transceiver device 1002 can generate different MMW data (e.g., different services) signals for radio transmission to different directions based on which coupling points these MMW data signals are applied to.

For example, data (e.g., service A—streaming music) that is generated by baseband signal receiver/generator 1008A is up-converted to a MMW carrier frequency using mixer 1012A and millimeter-wave signal generator 1010A. This first up-converted MMW data signal is thus amplified and coupled to coupling point 1024 based on the switch control unit 1023 actuating switch SW"$_1$ to position 'a'. At the coupling point 1024, the antenna array structure 1004 radio transmits the first up-converted MMW data along a first propagation direction. Also, data (e.g., service B—streaming video) that is generated by baseband signal receiver/generator 1008B is up-converted to a MMW carrier frequency using mixer 1012B and millimeter-wave signal generator 1010B. This second up-converted MMW data signal is thus amplified and coupled to coupling point 1026 based on the switch control unit 1023 actuating switch SW"2 to position 'a'. At the coupling point 1026, the antenna array structure 1004 radio transmits the second up-converted MMW data along a second propagation direction. Similarly, data (e.g., service C—storage data) that is generated by baseband signal receiver/generator 1008N is up-converted to a MMW carrier frequency using mixer 1012N and millimeter-wave signal generator 1010N. This third up-converted MMW data signal is thus amplified and coupled to coupling point 1028 based on the switch control unit 1023 actuating switch SW"$_N$ to position 'a'. At the coupling point 1028, the antenna array structure 1004 radio transmits the third up-converted MMW data along a third propagation direction.

In the receive mode, a MMW radio signal that is received via the antenna array structure is pre-amplified, down-converted to a baseband frequency, and demodulated to retrieve the data. In the embodiment depicted in FIG. 10, each of the MMW transceiver devices 1002A-1002N within MMW transceiver device 1002 can receive different MMW radio (e.g., different services) signals received from different directions based on which coupling points these MMW radio signals are received at.

For example, a first MMW radio signal is received at coupling point 1024 from a first propagation direction. Based on the switch control unit 1023 actuating switch SW"$_1$ to position 'b', the received first MMW radio signal is amplified by power amplifier 1017a. Using the millimeter-wave signal generator 1010A and frequency mixer 1012A, the amplified first MMW radio signal is then down-converted to a baseband frequency for demodulation and processing by the baseband signal receiver/generator 1008A in order to extract the data (e.g., service A—streaming music). Also, a second MMW radio signal is received at coupling point 1026 from a second propagation direction. Based on the switch control unit 1023 actuating switch SW"$_2$ to position 'b', the received second MMW radio signal is amplified by power amplifier 1017b. Using the millimeter-wave signal generator 1010B and frequency mixer 1012B, the amplified second MMW radio signal is then down-converted to a baseband frequency for demodulation and processing by the baseband signal receiver/generator 1008B in order to extract the data (e.g., service B—streaming video). Similarly, a third MMW radio signal is received at coupling point 1028 from a third propagation direction. Based on the switch control unit 1023 actuating switch $SW''_N$ to position 'b', the received third MMW radio signal is amplified by power amplifier 1017n. Using the millimeter-wave signal generator 1010N and frequency mixer 1012N, the amplified third MMW radio signal is then down-converted to a baseband frequency for demodulation and processing by baseband signal receiver/generator 1008N in order to extract the data (e.g., service C—storage data).

Figure 11:
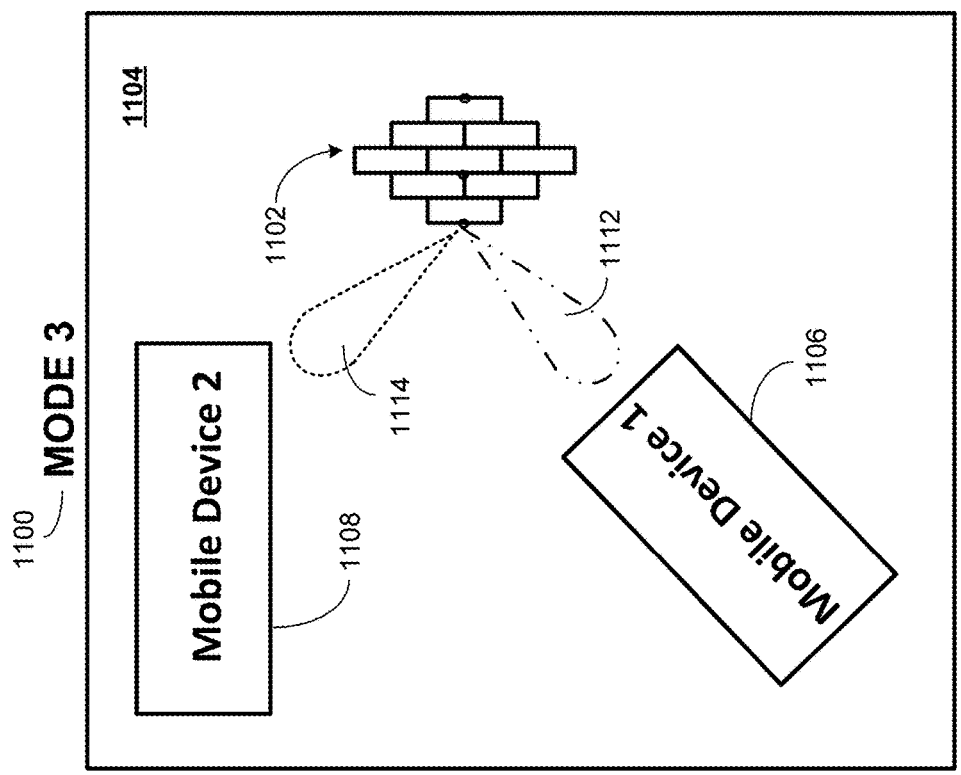
FIG. 11 shows operational modes associated with the millimeter-wave (MMW) communication systems of FIGS. 8-10, according to one embodiment.

FIG. 11 shows operational modes associated with the millimeter-wave (MMW) communication systems of FIGS. 8-10, according to one embodiment. As depicted, an antenna array structure 1102 may be located on a surface 1104 of, for example, a table, a mobile device (e.g., smartphone) display or housing, or other device surface. The antenna array structure 1102 may also be coupled to any communication device identical to, or similar to, those depicted and described in relation to FIGS. 8-10. Moreover, the antenna array structure 1102 may communicate with mobile devices 1106 and 1108, whereby each of the mobile devices 1106, 1108 include an identical or similar communication system to those depicted and described in relation to the MMW systems of FIGS. 8-10.

In one mode of operation 1100, the antenna array structure 1102 may concurrently direct LOS communications to multiple target devices. For example, as described in the foregoing, utilizing a first coupling point on the antenna array structure 1102 in a transmit mode, a data modulated MMW signal carrying a data service (e.g., data service A: video conference data) is transmitted via one transceiver device at a first propagation direction to mobile device 1108. Concurrently or alternatively, by using another coupling point on the antenna array structure 1102, a data modulated MMW signal carrying another data service (e.g., data service B: image data files) is transmitted via another transceiver device at a second propagation direction to mobile device 1106. Although for illustrative brevity only two mobile devices 1106, 1108 and two propagation directions are described, multiple coupling points on the antenna array structure 1102 may be utilized in a manner that facilitates generating concurrent (i.e., from two or more transceiver devices) or alternative (i.e., from one transceiver device) LOS signal transmissions corresponding to different data services to multiple mobile devices located in the periphery of surface 1104.

Moreover, utilizing the first coupling point on the antenna array structure 1102 in a receive mode, a data modulated MMW signal generated by mobile device 1108 is received at a transceiver device from a first propagation direction. Alternatively or concurrently, by using another coupling point on the antenna array structure 1102, another data modulated MMW signal generated by mobile device 1106 is received at another transceiver device from a second propagation direction. Although for illustrative brevity only two mobile devices 1106, 1108 and two propagation directions are described, multiple coupling points on the antenna array structure 1102 may be utilized in a manner that facilitates concurrently (i.e., at two or more transceiver devices) or alternatively (i.e., at one transceiver device) receiving LOS signal transmissions from multiple mobile devices located in the periphery of surface 1104.

As described above, different data (i.e., different data services) may be communicated between mobile devices 1106, 1108. As such, in one mode, different data services may be simultaneously communicated (i.e., transmitted or received) in different radio propagation directions to separate mobile devices that are at two different spatial locations. According to another mode, however, different data services may be communicated (i.e., transmitted or received) in different radio propagation directions to separate mobile devices that are at two different spatial locations during different time periods. For example, data (e.g., data service A) may first be directionally communicated (i.e., transmitted or received) 1112 to mobile device 1106 during time interval $T_1$, while data (e.g., data service B) may be directionally radio communicated (i.e., transmitted or received) 1114 to mobile device 1108 during a later time interval $T_2$, which follows $T_1$.

Figure 12:
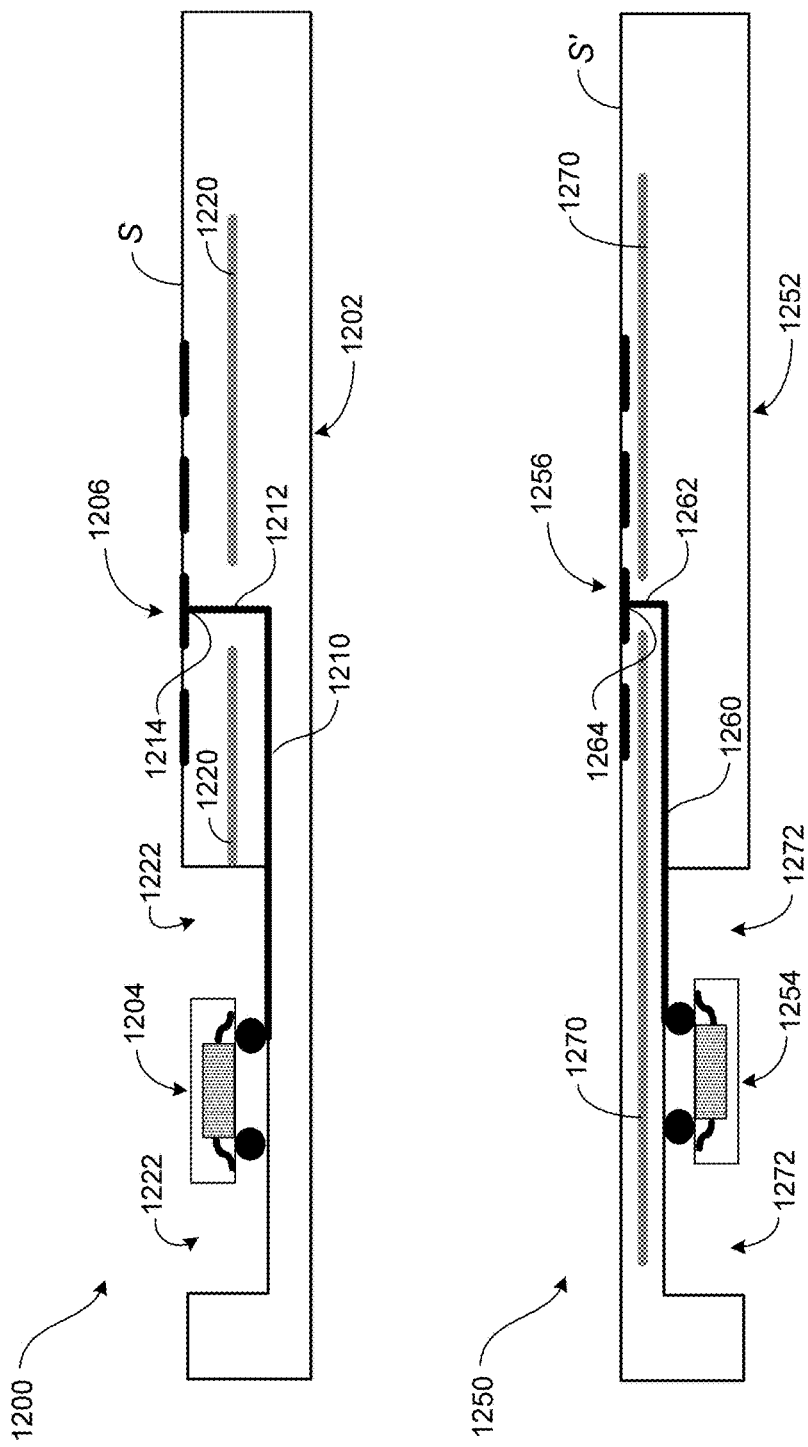
FIG. 12 shows implementation aspects for the MMW communication systems, according to different embodiments.

FIG. 12 shows implementation aspects for MMW communication systems, according to different embodiments. In a first exemplary embodiment, MMW communication system 1200 is disposed on a substrate 1202. The MMW communication system 1200 includes a MMW communications device 1204 packaged as a radio frequency integrated circuit (RFIC) and an antenna array structure 1206 that is coupled to the communications device 1204. The MMW communications device 1204 may be a MMW transmitter device, a MMW receiver device, or a MMW transceiver device identical to, or similar to, those described in relation to FIGS. 4-7 and 8-10. The substrate 1202 may include a system board (i.e., multilayer circuit board), a 3D chip integration coupled to one or more ICs (not shown), a device housing, a smart table (i.e., conference room table—see example shown in FIG. 13), or generally, any surface that can be used to integrate an antenna array structure and MMW communication device. As depicted, the communications device 1204 is connected to the coupling point 1214 of antenna array structure 1206 via antenna feed 1210 and probe 1212. Moreover, a ground plane 1220 is located between the antenna feed 1210 and the antenna array structure 1206 disposed on the surface S of the substrate 1202. Thus, the ground plane 1210 provides noise shielding to the antenna array structure 1206. As further depicted, the MMW communication device 1204 is located within a top surface cavity 1222 of the substrate 1202.

Still referring to FIG. 12, according to a second exemplary embodiment, MMW communication system 1250 is disposed on a substrate 1252. The MMW communication system 1250 includes a MMW communications device 1254 packaged as a radio frequency integrated circuit (RFIC) and an antenna array structure 1256 that is coupled to the communications device 1254. The MMW communications device 1254 may be a MMW transmitter device, a MMW receiver device, or a MMW transceiver device identical to, or similar to, those described in relation to FIGS. 4-7 and 8-10. The substrate 1252 may include a system board (i.e., multilayer circuit board), a 3D chip integration coupled to one or more ICs (not shown), a device housing, a smart table (i.e., conference room table—see example shown in FIG. 13), or generally, any surface that can be used to integrate an antenna array structure and MMW communication device. As depicted, the communications device 1254 is connected to the coupling point 1264 of antenna array structure 1256 via antenna feed 1260 and probe 1262. Moreover, a ground plane 1270 is located between the antenna feed 1260 and the antenna array structure 1256 disposed on the surface S' of the substrate 1252. As depicted, the ground plane 1270 further extends over the MMW communications device 1254. As further depicted, the MMW communication device 1254 is located within a bottom surface cavity 1272 of the substrate 1252. Thus, housing the MMW communication device 1204 within the bottom surface cavity 1272 of the substrate 1252 facilitates extending the ground plane 1270 to provide noise shielding to not only the antenna array structure 1256, but also the MMW communications device 1254.

Figure 13:
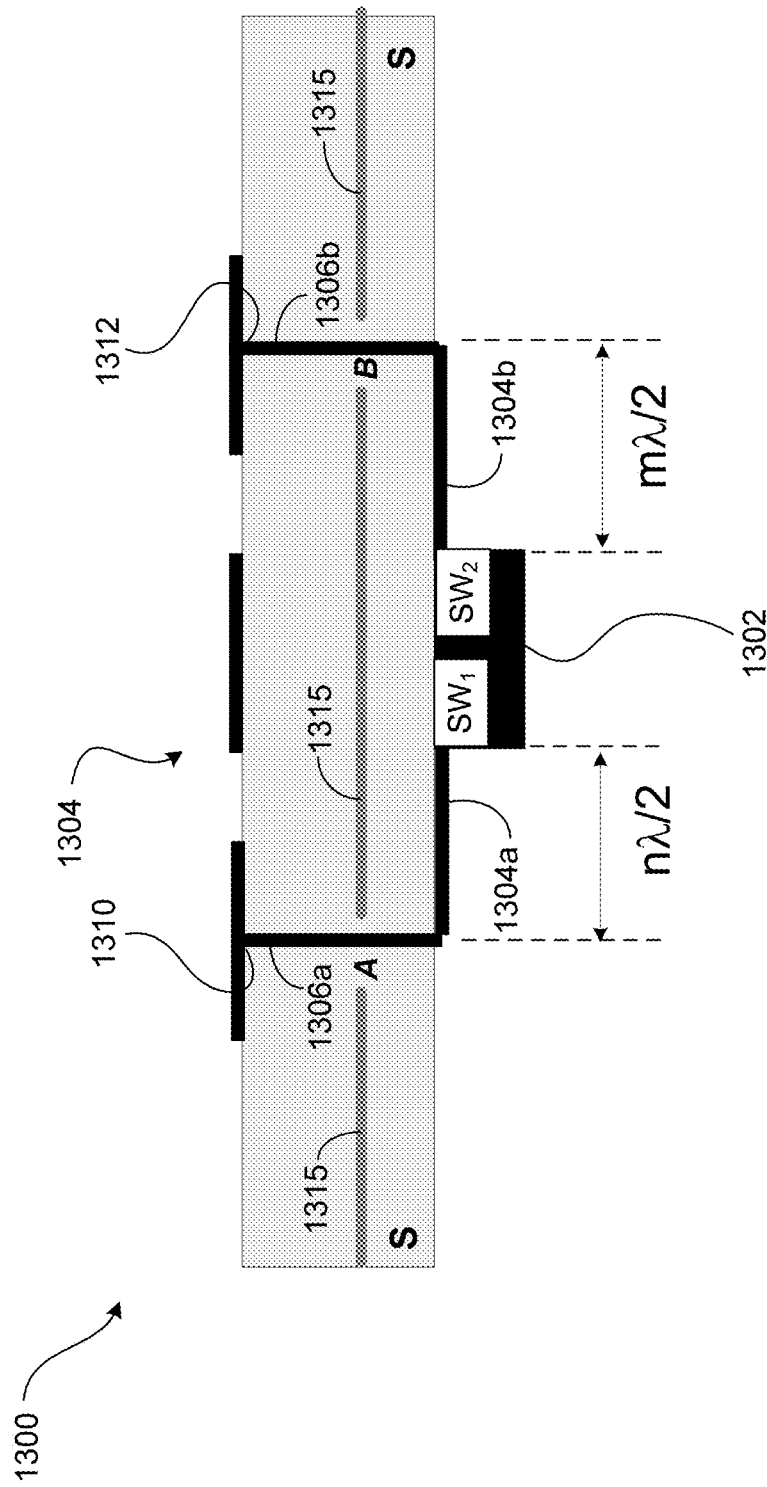
FIG. 13 shows a connection implementation between a bank of RF switches within a MMW communication device and an antenna array structure, according to one embodiment.

FIG. 13 shows a connection implementation 1300 between a bank of RF switches that couples signals generated by a MMW communication device to an antenna array structure, according to one embodiment. For example, the connection implementation 1300 may be utilized with respect to any one of the MMW communication systems corresponding to FIGS. 4-6 and 8-10. More specifically, referring to FIG. 4, according to one example, connection implementation 1300 may be utilized to connect switch bank 419 to coupling points 424-428.

As depicted in FIG. 13, a bank of RF switches 1302 is connected to antenna array structure 1304 via antenna feeds 1304a and 1304b, and respective probes 1306a and 1306b. For example, the bank of RF switches 1302 may include switches such as $SW_1$ and $SW_2$. The probes 1306a, 1306b are coupled to coupling points 1310 and 1312 through openings 'A' and 'B' of ground plane 1315. The length of the antenna feeds 1304a, 1304b between the bank of RF switches 1302 and the probes 1306a, 1306b are selected to be multiples of the effective substrate (S) half wavelength of the carrier frequency (e.g., 60 GHz) being transmitted by the antenna array structure 1304. In particular, the length of the antenna feed 1304a between switch $SW_1$ of the RF switches 1302 and probe 1306a is selected to be a multiple of the effective substrate half wavelength of the carrier frequency (e.g., 60 GHz). Also, the length of the antenna feed 1304b between switch $SW_2$ of the RF switches 1302 and probe 1306b is selected to be a multiple of the effective substrate half wavelength of the carrier frequency (e.g., 60 GHz). Thus, the length of antenna feed 1304a is $n\lambda/2$, where $\lambda$ is the effective substrate half wavelength of the carrier frequency (e.g., 60 GHz) and 'n' is an integer value. Further, the length of antenna feed 1304b is $m\lambda/2$, where $\lambda$ is the effective substrate wavelength of the carrier frequency (e.g., 60 GHz) and 'm' is an integer value. In the described implementation, the multiple of half wavelengths ($m\lambda/2$, $n\lambda/2$) associated with the length of the antenna feeds 1304a, 1304b enables the integration of the bank of RF switches 1302 within the MMW communication device. In the depicted implementation, when a switch within the bank of RF switches 1302 is in an off state, the antenna needs to see an open circuit (high impedance) at the antenna coupling point. This is achieved by establishing the antenna feed length to be a multiple of half wavelengths ($m\lambda/2$, $n\lambda/2$). Further, 'm' and 'n' can either be identical or have different values.

In other implementations, however, signals to the antenna array structure 1304 may be controlled without the use of the bank of RF switches 1302. In such an embodiment, for example, application of a signal to a particular coupling point associated with the antenna array structure 1304 may be turned OFF or ON by controlling the power that is provided to the amplifier device driving the feed that sends the signal to the particular coupling point.

Figure 14:
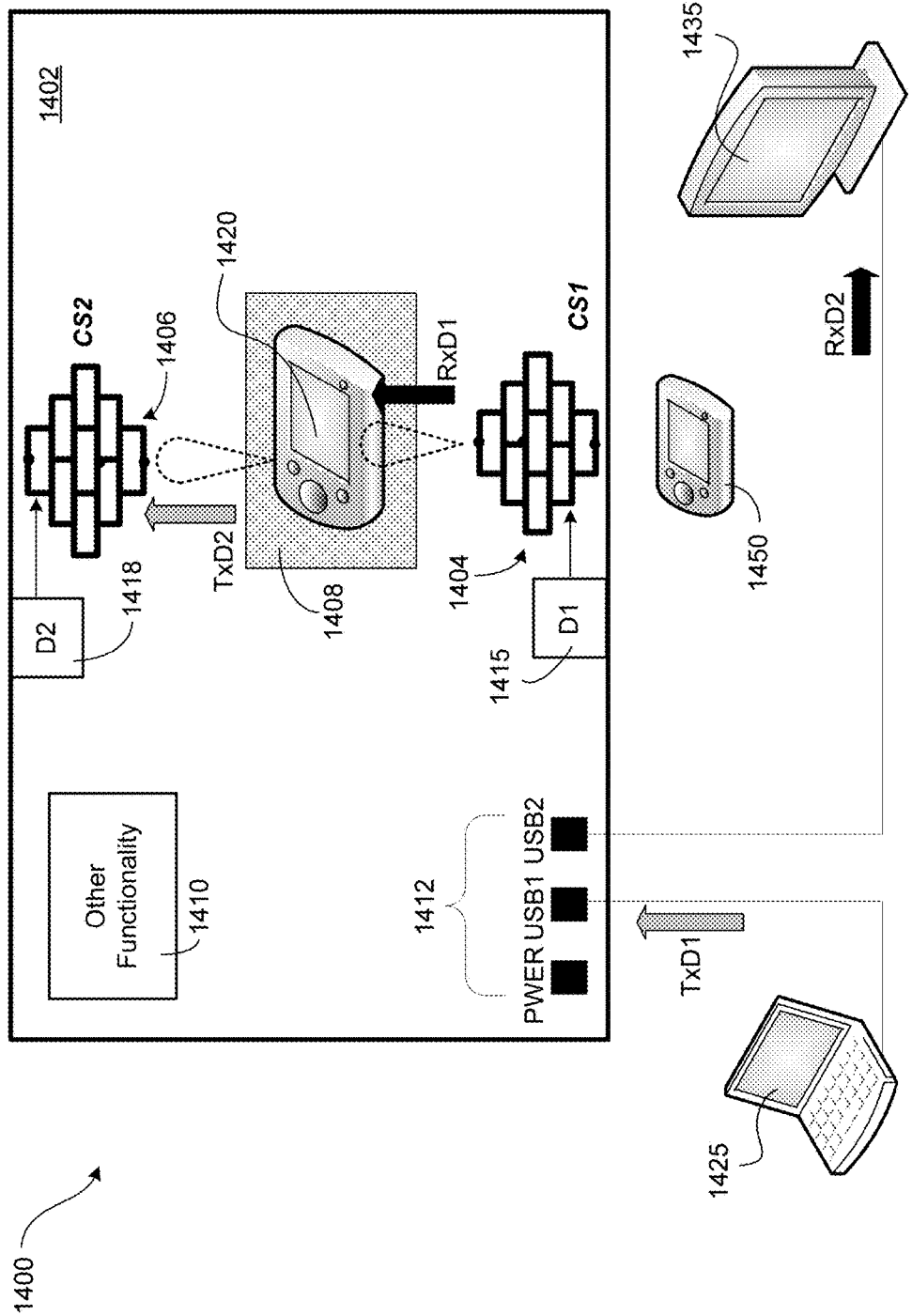
FIG. 14 shows an example application of a MMW communication system, according to one embodiment.

FIG. 14 shows an example application 1400 of a MMW communication system, according to one embodiment. In particular, the MMW communication system may be incorporated into a conference room table 1402 (i.e., a smart table type design), or any other platform. The table may include antenna array structures 1404, 1406, a smart phone charger station 1408, other functional features (e.g., projector screen controller, in-built WiFi, etc.) 1410, and peripheral connectors 1412 (e.g., power outlets, USB1 connector, USB2 connection, etc.). One communication system CS1 includes a MMW communication device 1415 (e.g., transceiver) that is embedded within the table 1402 and coupled to antenna array structures 1404, while another communication system CS2 includes a MMW communication device 1418 (e.g., transceiver) that is also embedded within the table 1402 and coupled to antenna array structures 1406. Although the antenna array structures 1404, 1406 may be identical to, or similar to, the antenna array structure of FIG. 1, any one or more of the antenna array structures depicted in FIGS. 2 and 3 may be utilized.

The antenna array structures 1404, 1406 may be formed on the top surface of the table, while their respective MMW communication devices 1415, 1418 may be located, for example, within a cavity formed within the table 1402. Based on application, MMW communication devices 1415 and 1418 include any of the devices corresponding to FIGS. 4-6 and 8-10. For example, MMW communication devices 1415 and 1418 may each be identical to MMW transceiver device 602 of FIG. 6. Similarly, a mobile device 1420 (e.g., smart phone) located on the charger station 1408 may also include a MMW communication system identical to, or similar to, those depicted in FIGS. 4-6 and 8-10. For example, the mobile device 1420 (e.g., smart phone) may include a transceiver device and antenna array structure identical to the MMW transceiver device 602 and antenna array structure 604 of FIG. 6. Thus, directional LOS MMW radio communications may be exchanged between the mobile device 1420 and communication system CS1.

Still referring to FIG. 14, according to another exemplary operational example, computers 1425 and 1435 may exchange large amounts of data via MMW communication system CS1 and CS2. According to one example, computer 1425 desires to exchange a large volume of stored data files with mobile device 1420. As such, computer 1425 sends data (TxD1) to MMW communication system CS1 via USB connector USB1. The data is then received and radio transmitted at a MMW frequency by MMW communication system CS1 to mobile device 1420, as indicated by RxD1. According to another example, mobile device 1420 desires to exchange a large volume of stored data files with computer 1435. As such, mobile device 1420 transmits data (TxD2) at a MMW frequency (e.g., 60 GHz) to MMW communication system CS2. MMW communication system CS2 then receives and forwards the data to computer 1435 via USB connector USB2, as indicated by RxD2.

The MMW communication systems of the embodiments described herein allow for large amounts of data to be radio transmitted at MMW frequencies in a single transmission, which in turn significantly reduces data transfer times as a result providing high-data-capacity links. Additionally, the MMW communication systems can dynamically steer the LOS communications directionally in order to, among other things, maximize signal reception (i.e., increased signal-to-noise ratio) at an intended communication device (e.g., computer, mobile device, etc.). For example, MMW communication system CS2 can transmit data to mobile device 1420 along a first propagation direction using antenna array structure 1406. However, MMW communication system CS2 can either simultaneously or alternative transmit the same or different data to mobile device 1450 along a second propagation direction using antenna array structure 1406.

In the present disclosure, the term power amplifier means any device or chain of devices that amplifies signals prior to radio transmission (i.e., at a transmitter) or following radio signal reception (i.e., at a receiver). For a receiver, the power amplifier can include a low noise amplifier (LNA), while for a transmitter, a power amplifier (PA) is an amplification device used to boost high S/N ratio signals prior to radio transmission.

Figure 15:
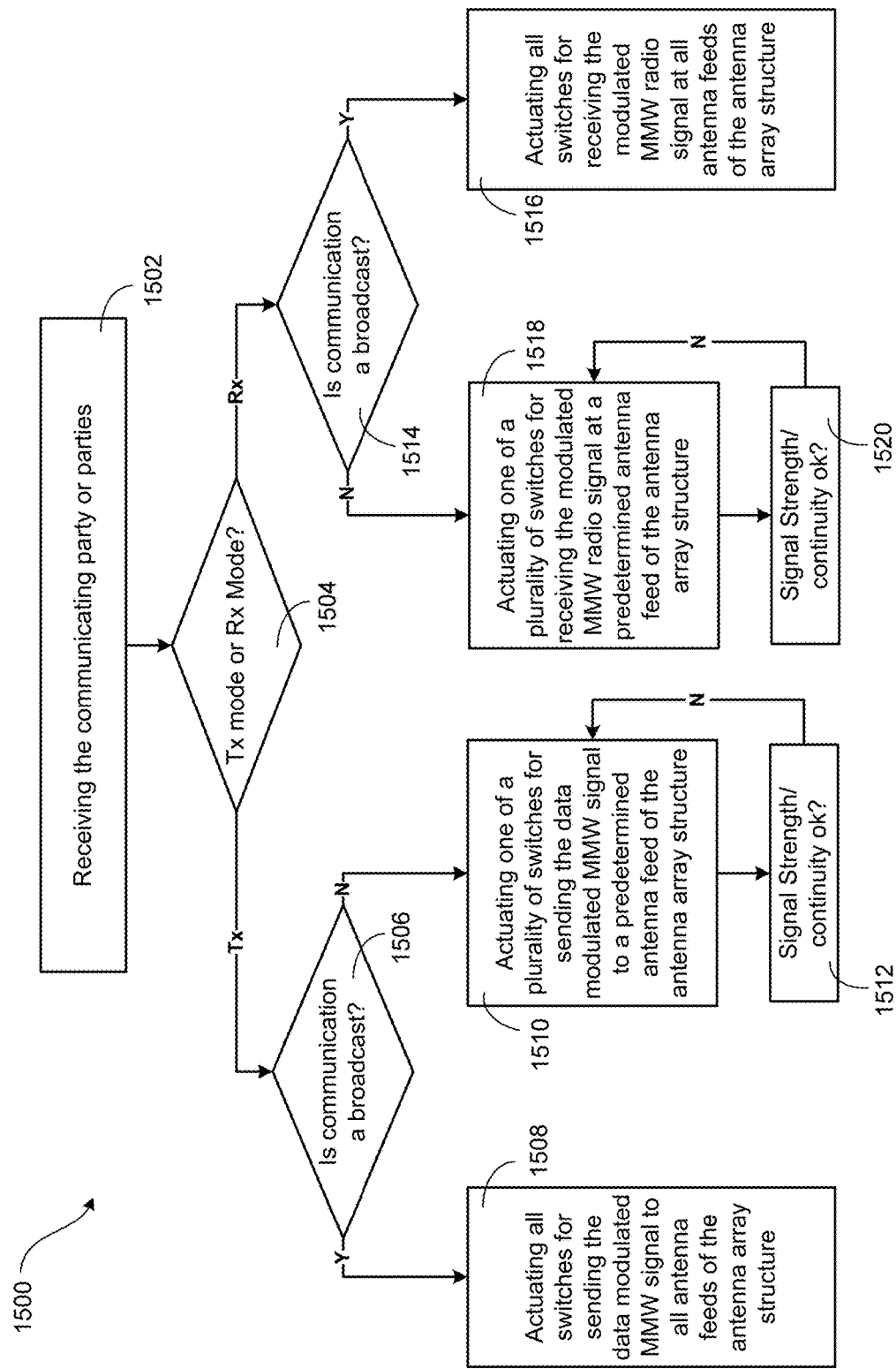
FIG. 15 shows an exemplary process for controlling the switches associated with MMW the communication systems corresponding to FIGS. 4-6 and 8-10, according to one embodiment.

FIG. 15 shows an exemplary process 1500 (i.e., a Communication Switch Control (CSC) Program) for controlling the switches associated with the MMW communication systems corresponding to FIGS. 4-6 and 8-10, according to one embodiment. Process 1500 may be implemented as software, hardware, firmware, or any combination thereof. FIG. 15 will be described with the aid of the MMW communication system 600 depicted in FIG. 6. It may also be appreciated that in an alternative embodiment, process 1500 has the capability of controlling the application of power to the various power amplifier components in order to control whether signals are coupled to or received from the antenna structure.

At 1502, information regarding the intended communicating parties are received. For example, switch control unit 623 may receive information that the intended communicating parties are recipients 'A' and 'B' (see FIG. 1). At 1504, it is determined whether communications with one or more of the intended recipients (A & B) will be a transmission or receive operation. For example, at 1504, it is determined whether communications with MMW communication system 600 be a MMW signal reception or a transmission of a MMW radio signal.

Once it is determined that the MMW communication system 600 will operate in a transmit mode (1504), at 1506 it is further established whether the transmission will be directed to a single intended recipient or a broadcast to all recipients. For example, a determination will be made as to whether the MMW communication system 600 will transmit a MMW radio signal to recipient A or B, or whether a MMW radio signal is to be broadcast to both recipients A and B.

If the transmission is a broadcast, at 1508 all relevant switches are actuated to enable sending the data modulated MMW signals to all the required antenna feeds and coupling points on the antenna array structure. For example, within MMW communication system 600, switches $SW'_1$ and $SW'_2$ are actuated by the switch control unit 623 of MMW transceiver 602. This enables data modulated MMW signals to be sent to coupling points 624 and 626 of the antenna array structure 604 for broadcasting to multiple recipients such as recipients A and B.

If the transmission is not a broadcast, at 1510 a predetermined switch is actuated to enable sending a data modulated MMW signal to a required antenna feed and coupling point on the antenna array structure. For example, within MMW communication system 600, switch $SW'_1$ or $SW'_2$ is actuated by the switch control unit 623 of MMW transceiver 602. This enables the data modulated MMW signal to be sent to either coupling point 624 or 626 of the antenna array structure 604. Thus, depending on the coupling point 624, 626 utilized, the data modulated MMW signal is directionally sent to either recipient A or B.

At 1512, the signal strength and continuity of the signal strength is processed in order to determine whether the actuation of one or more of the switches should be changed to establish a more accurate LOS communication path. For example, switch $SW'_1$ may be actuated (e.g., $SW'_1$=CLOSED) by the switch control unit 623 of MMW transceiver 602 in order to establish a LOS communication path to recipient A. If recipient A fails to acknowledge initial receipt of the transmission from MMW transceiver 602 within a predefined time period and/or number of transmission tries, the switch control unit 623 of MMW transceiver 602 changes the switch actuation configuration (e.g., $SW'_1$=OPEN; $SW'_2$=CLOSED) to send the transmission along another LOS communication path. In this exemplary scenario, recipient A may have changed its position. Thus, using different switch configurations, the position of an intended recipient may be determined based on eventually receiving an acknowledgement from the recipient (e.g., recipient A) and measuring the received signal strength.

If, however, it is determined that the MMW communication system 600 will operate in a receive mode (1504), at 1514 it is further established whether the signal reception will be from a single intended recipient or a broadcasted signal. For example, a determination will be made as to whether the MMW communication system 600 will receive a MMW radio signal from transmitting party A or B (see FIG. 1), or whether a received MMW radio signal is to be broadcast from transmitting party A or B.

If the intended reception is from a broadcast, at 1516 all relevant switches are actuated to enable receiving the broadcast data modulated MMW signal at all the required antenna feeds and coupling points on the antenna array structure. For example, within MMW communication system 600, switches $SW'_1$ and $SW'_2$ are actuated by the switch control unit 623 of MMW transceiver 602. This enables the received data modulated MMW signal to be received at coupling points 624 and 626 of the antenna array structure 604 based on the broadcast from either transmitting party A or B.

If the signal reception is not a broadcast, at 1518 a predetermined switch is actuated to enable receiving a data modulated MMW signal at a required antenna feed and coupling point on the antenna array structure. For example, within MMW communication system 600, switch $SW'_1$ or $SW'_2$ is actuated by the switch control unit 623 of MMW transceiver 602. This enables the data modulated MMW signal to be received to either coupling point 624 or 626 of the antenna array structure 604. Thus, depending on the coupling point 624, 626 utilized, the data modulated MMW signal is directionally received from either transmitting party A or B. More specifically, for example, actuating switch $SW'_1$ enables the data modulated MMW signal to be received at coupling point 624 of the antenna array structure 604, while actuating switch $SW'_2$ enables the data modulated MMW signal to be received at coupling point 626 of the antenna array structure 604.

At 1520, the signal strength and continuity of the signal strength is processed in order to determine whether the actuation of one or more of the switches should be changed to establish a more accurate LOS communication path. For example, switch $SW'_1$ may be actuated (e.g., $SW'_1$=CLOSED) by the switch control unit 623 of MMW transceiver 602 in order to establish a LOS communication path from transmitting party A. If a transmission from transmitting party A is not received by MMW transceiver 602 within a predefined time period and/or number of transmission tries, the switch control unit 623 of MMW transceiver 602 changes the switch actuation configuration (e.g., $SW'_1$=OPEN; $SW'_2$=CLOSED) to establish signal reception along another LOS communication path. In this exemplary scenario, transmitting party A may have changed its position. Thus, using different switch configurations, the position of a communicating transmitting party may be determined based on eventually receiving the data modulated MMW signal from the transmitting party (e.g., transmitting party A) at a particular signal strength. In one implementation, based on the received signal being above a certain predetermined threshold, it is determined that the transmitting party is at a particular location.

Within each of the exemplary MMW communication system embodiments described above, the transmitter, receiver, or transceiver devices may alternatively not include any baseband signal source and/or receiver devices (e.g., FIG. 4: 408, FIG. 5: 508, etc.), and thus, include MMW signal generators (e.g., FIG. 4: 410, FIG. 5: 510, etc.), mixers (e.g., FIG. 4: 412, FIG. 5: 512, etc.), amplifiers (e.g., FIG. 4: 416*a-n*, FIG. 5: 516*a-n*, etc.), and in some instances, power-splitter/combiners (e.g., FIG. 4: 414, FIG. 5: 514, etc.). In such embodiments, data to be transmitted, or data to be received and processed, may be provided from another device (i.e., located either remotely or in proximity).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 16:
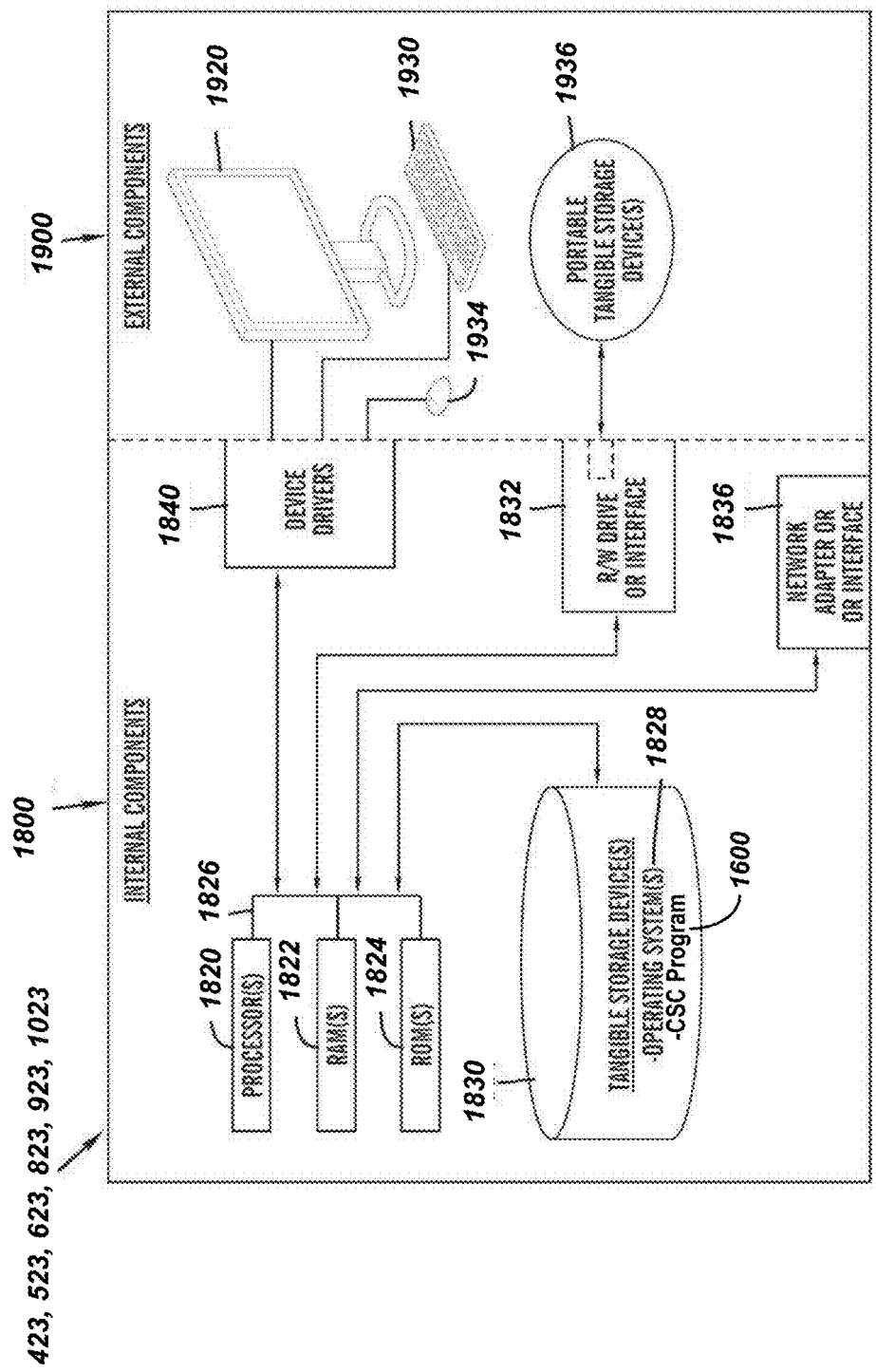
FIG. 16 is a block diagram of hardware and software for executing the process flow of FIG. 15, according to one embodiment.

FIG. 16 shows a block diagram of the components of a data processing system 1800, 1900, that may be incorporated within switch control units 423, 523, 623, 823, 923, or 1023 (FIGS. 4-6 & 8-10) in accordance with an illustrative embodiment of the present invention. It should be appreciated that FIG. 16 provides only an illustration of one implementation and does not imply any limitations with regard to the environments in which different embodiments may be implemented. Many modifications to the depicted environments may be made based on design and implementation requirements.

Data processing system 1800, 1900 is representative of any electronic device capable of executing machine-readable program instructions. Data processing system 1800, 1900 may be representative of a smart phone, a computer system, PDA, or other electronic devices. Examples of computing systems, environments, and/or configurations that may represented by data processing system 1800, 1900 include, but are not limited to, personal computer systems, server computer systems, thin clients, thick clients, handheld or laptop devices, multiprocessor systems, microprocessor-based systems, network PCs, minicomputer systems, and distributed cloud computing environments that include any of the above systems or devices.

The data processing system 1800, 1900 may include a set of internal components 800 and a set of external components 1900 illustrated in FIG. 16. The set of internal components 800 includes one or more processors 1820, one or more computer-readable RAMs 1822 and one or more computer-readable ROMs 1824 on one or more buses 1826, and one or more operating systems 1828 and one or more computer-readable tangible storage devices 1830. The one or more operating systems 1828 and programs such as Communication Switch Control (CSC) Program 1600 (also see FIG. 15) is stored on one or more computer-readable tangible storage devices 1830 for execution by one or more processors 1820 via one or more RAMs 1822 (which typically include cache memory). In the embodiment illustrated in FIG. 16, each of the computer-readable tangible storage devices 1830 is a magnetic disk storage device of an internal hard drive. Alternatively, each of the computer-readable tangible storage devices 1830 is a semiconductor storage device such as ROM 1824, EPROM, flash memory or any other computer-readable tangible storage device that can store a computer program and digital information.

The set of internal components 1800 also includes a R/W drive or interface 1832 to read from and write to one or more portable computer-readable tangible storage devices 1936 such as a CD-ROM, DVD, memory stick, magnetic tape, magnetic disk, optical disk or semiconductor storage device. The CSC program 1600 can be stored on one or more of the respective portable computer-readable tangible storage devices 1936, read via the respective R/W drive or interface 1832 and loaded into the respective hard drive 1830.

The set of internal components 1800 may also include network adapters (or switch port cards) or interfaces 836 such as a TCP/IP adapter cards, wireless wi-fi interface cards, or 3G or 4G wireless interface cards or other wired or wireless communication links. CSC program 1600 can be downloaded from an external computer (e.g., server) via a network (for example, the Internet, a local area network or other, wide area network) and respective network adapters or interfaces 1836. From the network adapters (or switch port adaptors) or interfaces 1836, the CSC program 1600 is loaded into the respective hard drive 1830. The network may comprise copper wires, optical fibers, wireless transmission, routers, firewalls, switches, gateway computers and/or edge servers.

The set of external components 1900 can include a computer display monitor 1920, a keyboard 1930, and a computer mouse 1934. External component 1900 can also include touch screens, virtual keyboards, touch pads, pointing devices, and other human interface devices. The set of internal components 1800 also includes device drivers 1840 to interface to computer display monitor 1920, keyboard 1930 and computer mouse 1934. The device drivers 1840, R/W drive or interface 1832 and network adapter or interface 1836 comprise hardware and software (stored in storage device 1830 and/or ROM 1824).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A millimeter-wave (MMW) communication system, comprising:
an antenna array structure operating within a MMW band, the antenna array structure having both a first antenna coupling point at a first location of the antenna array structure and a second antenna coupling point at a second location of the antenna array structure, the first and the second location of the antenna coupling points being within a coplanar surface on which the antenna array structure is formed;
a single MMW transmitter device having a power splitter that splits a data modulated MMW signal into a first MMW data modulated signal and a second MMW data modulated signal identical to the first MMW data modulated signal, the first data modulated MMW signal coupled to the first antenna coupling point and the second data modulated MMW signal coupled to the second antenna coupling point;
a first switch that receives the first MMW data modulated signal;
a first antenna feed line having a first end that is coupled to the first switch, wherein the first switch switches the first MMW data modulated signal to the first end of the first antenna feed line; and
a first antenna probe coupled to a second end of the first antenna feed line, the first antenna probe coupling the first MMW data modulated signal received from the second end of the first antenna feedline to the first antenna coupling point,
wherein coupling the first data modulated MMW signal to the first antenna coupling point generates a first MMW radio signal transmitted at a first propagation direction by the antenna array structure,
wherein coupling the second data modulated MMW signal to the second antenna coupling point generates a second MMW radio signal transmitted at a second propagation direction different to the first propagation direction by the antenna array structure, and wherein the first antenna feed line includes a length of $n\lambda_1/2$ from the first end of the first antenna feed line to the second end of the first antenna feed line, $\lambda_1$ an effective carrier frequency wavelength corresponding to the first MMW data modulated signal and n being a positive integer value.

2. The system of claim 1, wherein the first propagation direction and the second propagation direction are located within a plane that is perpendicular to the coplanar surface, the first propagation direction having a first altitude angle and the second propagation direction having a second altitude angle, the second altitude angle including an angle value that is different than the first altitude angle.

3. The system of claim 1, wherein the single transmitter device further comprises:
a baseband signal generator;
a MMW signal generator;
a frequency mixer having a first mixer input, a second mixer input, and a mixer output, wherein the first mixer input is coupled to the baseband signal generator, the second mixer input is coupled to the MMW signal generator, and the mixer output is coupled to an input of the power splitter;
a first power amplifier having a first amplifier input and a first amplifier output, the first amplifier input coupled to a first output of the power splitter and the first amplifier output coupled to the first antenna coupling point; and
a second power amplifier having a second amplifier input and a second amplifier output, the second amplifier input coupled to a second output of the power splitter and the second amplifier output coupled to the second antenna coupling point.

4. The system of claim 3, further comprising:
a first switch located between the first amplifier and the first antenna coupling point;
a second switch located between the second amplifier and the second antenna coupling point; and
a switch control unit including a first mode of operation and a second mode of operation, wherein during the first mode of operation only one of the first switch and the second switch is actuated to a closed position, and wherein during the second mode of operation both the first switch and the second switch are actuated to a closed position.

5. The system of claim 1, wherein the antenna array structure comprises a grid antenna having a plurality of loops, the grid antenna configured to operate within a millimeter-wave band of 57-66 GHz.

6. The system of claim 1, wherein the antenna array structure comprises a series fed patch antenna configured to operate within a millimeter-wave band of 57-66 GHz.

7. The system of claim 1, wherein the antenna array structure comprises a coupled patch antenna configured to operate within a millimeter-wave band of 57-66 GHz.

8. The system of claim 1, further comprising an outer surface area, wherein the antenna array structure includes radiator elements that are all located directly on the outer surface area.

9. The system of claim 8, wherein the outer surface area comprises an outer surface of a table.

10. The system of claim 8, wherein the outer surface area comprises an outer surface of a portable electronic device.

11. The system of claim 1, further comprising:
a second switch that receives the second MMW data modulated signal;
a second antenna feed line having a first end that is coupled to the second switch, wherein the second switch switches the second MMW data modulated signal to the first end of the second antenna feed line; and
a second antenna probe coupled to a second end of the second antenna feed line, the second antenna probe coupling the second MMW data modulated signal received from the second end of the second antenna feedline to the second antenna coupling point,
wherein the second antenna feed line includes a length comprising $m\lambda_2/2$ from the first end of the second antenna feed line to the second end the second antenna feed line, $\lambda_2$ being an effective carrier frequency wavelength corresponding to the second MMW data modulated signal and m being a positive integer value.

* * * * *